(12) United States Patent
Umayabashi et al.

(10) Patent No.: US 8,731,036 B2
(45) Date of Patent: May 20, 2014

(54) PACKET FILTER-BASED CLOCK SYNCHRONIZATION SYSTEM, APPARATUS, AND METHOD, AND PROGRAM THEREOF

(75) Inventors: Masaki Umayabashi, Tokyo (JP); Zhenlong Cui, Tokyo (JP); Kazuo Takagi, Tokyo (JP)

(73) Assignee: NEC Corporation, Tokyo (JP)

( * ) Notice: Subject to any disclaimer, the term of this patent is extended or adjusted under 35 U.S.C. 154(b) by 398 days.

(21) Appl. No.: 13/129,755

(22) PCT Filed: Nov. 20, 2009

(86) PCT No.: PCT/JP2009/069684
§ 371 (c)(1),
(2), (4) Date: May 17, 2011

(87) PCT Pub. No.: WO2010/058831
PCT Pub. Date: May 27, 2010

(65) Prior Publication Data
US 2011/0228834 A1    Sep. 22, 2011

(30) Foreign Application Priority Data
Nov. 20, 2008    (JP) .................................. 2008-296197

(51) Int. Cl.
*H04L 7/00*    (2006.01)

(52) U.S. Cl.
USPC ............................. 375/224; 375/356; 375/354

(58) Field of Classification Search
USPC .......................................... 375/224, 356, 354
See application file for complete search history.

(56) References Cited

U.S. PATENT DOCUMENTS

| | | | | |
|---|---|---|---|---|
| 5,982,828 A | * | 11/1999 | Fujimori et al. | 375/356 |
| 6,199,169 B1 | * | 3/2001 | Voth | 713/400 |
| 6,944,249 B2 | * | 9/2005 | Hartman et al. | 375/373 |

FOREIGN PATENT DOCUMENTS

| | | | |
|---|---|---|---|
| JP | 2000244473 A | 9/2000 |
| JP | 2000278275 A | 10/2000 |
| JP | 2001244809 A | 9/2001 |
| JP | 2004248123 A | 9/2004 |
| JP | 2004274766 A | 9/2004 |
| JP | 2006518557 A | 8/2006 |
| JP | 2007104347 A | 4/2007 |
| JP | 2007134873 A | 5/2007 |

(Continued)

OTHER PUBLICATIONS

International Search Report for PCT/JP2009/069684 mailed Jan. 19, 2010.

*Primary Examiner* — Michael Neff
(74) *Attorney, Agent, or Firm* — Sughrue Mion, PLLC

(57) ABSTRACT

A clock synchronization system synchronizes a clock of a slave node with a clock of a master node. The master node includes a packet transmitting unit that transmits a packet including a time stamp (TS) to the slave node. The slave node includes: a packet receiving unit that receives the packet transmitted from the master node; a packet filter unit that calculates as a value of delay of the packet a difference between a TS on the clock of the slave node when the packet is received and the TS of the packet received, corrects the value of the delay of the packet or a threshold for the delay of the packet, and performs filter processing on the packet received from the packet receiving unit based on the value of the delay of the packet and the threshold for the delay of the packet; and a phase synchronization unit that outputs the clock of the slave node based on the TS included in the packet employed.

13 Claims, 19 Drawing Sheets

(56) References Cited

FOREIGN PATENT DOCUMENTS

| | | |
|---|---|---|
| JP | 2007160976 A | 6/2007 |
| JP | 2007174676 A | 7/2007 |
| WO | 0150674 A | 7/2001 |
| WO | 2009034984 A | 3/2009 |
| WO | 2009035091 A | 3/2009 |

* cited by examiner

PACKET FILTER-BASED CLOCK SYNCHRONIZATION SYSTEM, APPARATUS, AND METHOD, AND PROGRAM THEREOF

The present application is the National Phase of PCT/JP2009/069684, filed Nov. 20, 2009, which is based on Japanese Patent Application No. 2008-296197 (filed Nov. 20, 2008), and claims priority according to the Paris Convention based on the Japanese Patent Application No. 2008-296197. The disclosed content of the Japanese Patent Application No. 2008-296197 is incorporated in the specification of the present application by reference to the Japanese Patent Application No. 2008-296197.

TECHNICAL FIELD

The present invention relates to a system, apparatus, method, and program for synchronizing the clocks of apparatuses through a packet network, and more particularly to a clock synchronization system, apparatus, and method for improving the clock synchronization accuracy between apparatuses, and a program thereof.

BACKGROUND ART

As the volume of data to be transferred in a network increases, telecommunications carriers have an increased need for inexpensive high-speed data communication networks. High-cost networks using the time division multiplexing (TDM) method are therefore being replaced with low-cost high-efficiency networks using the Internet Protocol (IP) method.

Some traffic transactions in a network need exact clock synchronization between the sending node side and the receiving node side. For example, exchanging real-time data such as sound and video with high quality needs data reproduction at predetermined timing, and accurate clocks are needed for that purpose.

In another example, mobile network services need exact clock synchronization in order to carry out intercell handover without a hitch. Specifically, base station devices on a mobile network need clock synchronization with accuracy as extremely high as 50 parts per billion (ppb) with wireless network control devices. If the clock synchronization accuracy of a base station device in service exceeds the required value, intercell handover may fail, which can result in missing data and a drop in communication quality.

In a typical TDM-based network, the receiving node can extract clock information on the transmitting node through the transmission channel. It has thus been possible to achieve high-accuracy clock synchronization between the transmitting and receiving nodes. In contrast, an IP-based network transfers data asynchronously. It follows that the pieces of data arrive at the receiving node with fluctuating intervals, and it has been difficult to extract highly accurate clock information from the received data. The receiving node therefore needs to determine the clock interval of the transmitting node in one way or another, and adjust its clock interval to that of the transmitting node. Such an adjustment of the clock interval of the receiving node to that of the transmitting node will be referred to as the receiving node reproducing the clock of the transmitting node.

As a technology for implementing highly accurate clock reproduction through a packet network typified by an IP network or the like, there has been proposed a time stamp method. The time stamp method is described in PTL 1, for example. A block diagram of the time stamp method will be shown in FIG. 1. FIG. 1 shows a situation where a transmitting node or master node 100 transmits packets 120 to a receiving node or slave node 110 through a packet network 130. The section from the master node 100 to the packet network 130 and the section from the packet network 130 to the slave node 110 both are connected by a TDM-based network. In the configuration of FIG. 1, the time stamp method hereinafter is used to perform synchronization control on the TDM flow between the master node lying at the entry edge and the slave node lying at the exit edge through the packet network 130.

According to the time stamp method, the transmitting node or master node 100 transmits packets 120 that contain a time stamp (hereinafter, referred to as "TS") to the receiving node or slave node 110. Here, TS refers to a value that shows time information generated based on the clock of the master node 100 or the slave node 110. For example, TS is a numerical value that increases by one per minimum time unit of the clock of the master node 100 (for example, 125 usec). The numerical value of the minimum time unit is the clock width. Hereinafter, clocks being in synchronization refers to that the master node and the slave node have the same clock width. It should be appreciated that the foregoing minimum time unit of the clock may be regarded as the speed of the clock. In such a case, being in synchronization refers to that the master node and the slave node have the same clock speed.

In FIG. 1, the packets 120 are a group of packets that are transmitted from the master node 100 at regular intervals. The packets are denoted by 120-1, 120-2, 120-3, 120-4, and 120-5 in order of transmission from the master node. Each of the packets 120 contains TS of the master node at the time of transmission. The packet 120-1 has a TS of 1, the packet 120-2 a TS of 2, the packet 120-3 a TS of 3, the packet 120-4 a TS of 4, and the packet 120-5 a TS of 5.

The packets 120 then arrive at the slave node 110 through the packet network 130 (see the upper part of FIG. 1). The slave node 110 adjusts its clock width according to the intervals of the packets 120 received from the master node 100 so as to synchronize the clock of the slave node 110 with that of the master node 100. Suppose, for example, that the clock of the master node 100 of FIG. 1 increases in TS by one for every 125 usec. In other words, the master node 100 has a clock width of 125 usec. The slave node 110, however, does not necessarily have a clock width of 125 usec, which may be different. In FIG. 1, the packet 120-1 and the packet 120-2 have a TS of 1 and 2, respectively. The interval between the packets is 1 in terms of TS, which is equivalent to 125 usec, the clock width of the master node 100.

Suppose that the transmission of the packets 120 from the master node 100 to the slave node 110 causes no delay. In such a case, the packet 120-1 and the packet 120-2 arrive at the slave node 100 at a TS of 1 and 2 on the clock of the slave node, respectively. Here, the slave node 110 recognizes the difference in TS between the packet 120-1 and the packet 120-2, i.e., 1 as the minimum time unit of the clock of the master node 100, i.e., 125 usec. Consequently, even if the clock width of the slave node 110 is different from that of the master node 100 (in this example, 125 usec), the slave node 110 can adjust its clock width to that of the master node 100 (in this example, 125 usec) for synchronization.

In fact, the packets 120 passed through the packet network 130 entail a delay in the timing of reception at the slave node 110. Suppose that the packets 120-1 and 120-2 arrive at the slave node 110 through the packet network 130 at a TS of 1 and 3 on the clock of the slave node, respectively. This means that the packet 120-2 lags by 1 in terms of TS. In such a case, the slave node 110 recognizes the difference in TS between the packet 120-1 and the packet 120-2, i.e., 2 as the minimum time unit of the clock of the master node 100, whose value is 250 usec. The slave node 110 then adjusts its clock width so that the clock has a minimum time unit of 250 usec. The result is that the clock width of the master node 100 is 125 usec and the clock width of the slave node 110 is 250 usec, i.e., the clock widths do not coincide with each other. Such a situation will be referred to as the master node 100 and the slave node 110 not being in synchronization.

Consequently, the interval at which the packets 120 passed through the packet network 130 arrive at the slave node 110 is different from the interval immediately after the transmission from the master node 100. It is therefore not possible for the slave node 110 to simply use the clock interval calculated from the TS of the received packets 120 as the clock interval of the master node 100 for control. The TS method is a method in which the slave node 110, after receiving the packets 120, adjusts its own clock for synchronization with the clock of the master node 100 by utilizing the TS that is stored as mentioned above. The operation of the clock synchronization according to the TS method will be described in more detail, along with the description of the configuration of the slave node 110.

The slave node 110 includes a packet receiving unit 146 and a phase locked loop (PLL) 140. The packet receiving unit 146 receives a packet 120 transferred from the master node 100 through the packet network 130. The received packet 120 is sent to the PLL 140. The PLL 140 calculates a difference between a TS that is generated from the clock of the slave node 110 when the packet 120 is received from the master node 100 (hereinafter, referred to as "generated TS") and the TS of the packet 120 received from the master node (hereinafter, referred to as "received TS").

Based on the difference, the PLL 140 adjusts the own clock for clock synchronization. In an example of configuration, as shown in FIG. 1, the PLL 140 includes a phase comparator 141, a low pass filter (LPF) 142, a proportion-integration (PI) circuit 143, a voltage control oscillator (VCO) 144, and a counter 145.

The phase comparator 141 calculates a difference signal between the received TS and the TS that is generated from the clock of the slave node 110. The difference signal is input to the LPF 142. The LPF 142 attenuates and interrupts signals with frequencies higher than a certain threshold and passes only lower frequencies as a signal, thereby eliminating jitters and noise that occur in the difference signal due to the passage through the packet network 130. The difference signal smoothened by the LPF 142 is input to the PI circuit 143. The PI circuit 143 calculates a control signal that makes the difference signal eventually converge to zero, and outputs the control signal to the VCO 144. The VCO 144 outputs a clock having a frequency that is determined by the control signal from the PI circuit 143. The clock on the slave side is thereby adjusted in width (interval). The counter 145 generates the TS on the slave side based on the adjusted clock, and passes the TS to the phase comparator 141. By such an operation of the PLL 140, the slave node 110 can reproduce the clock of the master node 110 for synchronization with the master node 100 even via the packet network 130.

Since the master node lying at the entry edge and the slave node lying at the exit edge constitute the foregoing configuration through the packet network, it is possible to perform synchronization control on the TDM flow through the packet network.

In a practical network, the data undergoes a queuing delay from routers or switches when being transferred in the packet network. As also discussed in PTL 2, the amount of delay D occurring in a network is typically determined as a difference between the TS that is generated based on the clock of the slave node when a packet arrives at the slave node (generated TS:Ts) and the TS that is stored in the received packet (received TS:Tm). By the time of arrival of a packet that reaches the slave node through a fluctuating network, a delay has therefore occurred in the TS at which the packet actually arrives at the slave node with respect to the received TS. Some packets are given large amounts of delay before arriving at the slave node. The LPF in the slave node performs the processing of smoothening randomness in the amount of delay occurring, thereby reducing the influence of delays. If, however, packets having large amounts of delay arrive due to network congestion or the like and the LPF fails to reduce the influence of the delays sufficiently, a certain type of noise is input to the clock synchronization circuit with a drop in synchronization accuracy. To avoid this, a packet filter function is used to perform filter processing on packets arriving from the master node to the slave node depending on the amounts of delay of the packets. The packet filter function is described, for example, in PTL 3.

FIG. 2 shows an example of distribution of the amounts of delay. In the example, the amounts of delay are distributed from near zero to several hundreds of microseconds. The packet filter function performs the filter processing of setting a threshold for the amount of delay, and employing the TS of packets whose amounts of delay are smaller than the threshold and rejecting the TS of packets whose amounts of delay are greater.

Such selective use discard of the TS of the packets that exceed the threshold in the amount of delay makes it possible to use only the TS of the packets that have small amounts of delay for clock synchronization control with improved synchronization accuracy.

FIG. 3 shows a slave node 310 that includes a packet filter unit. As compared to the slave node 110 in FIG. 1, there is added a packet filter unit 350. The packet filter unit 350 receives a packet arriving from the master node from the packet receiving unit 146, and determines the amount of delay D from the received TS that is stored in the packet (hereinafter, referred to as "Tm") and the TS that is generated by the slave node itself when the packet arrives (hereinafter, referred to as "Ts"). If the amount of delay D is smaller than a predetermined threshold Dth, the TS of the packet is employed. If the amount of delay D is greater, the TS of the packet is rejected. When employing the TS of the packet, the packet filter unit 350 performs the processing of passing the TS of the packet to the PLL 140.

FIG. 4 shows the timing flow of packets when using the packet filter function. A time axis 401 shows the time axis that indicates the timing in which the master node transmits packets to the slave node. In the example, a packet 405 is transmitted. A clock 402 of the master node (hereinafter, referred to as "master clock 402") is shown below the time axis 401. The master node transmits the packet 405 at the timing when the TS on the master clock 402 is 55. The packet 405 therefore contains a TS value of 55.

Next, a time axis 403 of the slave node and a clock 404 of the slave node (hereinafter, referred to as "slave clock 404") are shown below the master clock 402. In the example, the TS of the master clock 402 and the TS of the slave clock 404 at the same point in time are different from each other. For example, the TSs differ such that the master clock 402 has a TS of 70 when the slave clock 404 has a TS of 67. Despite the different TSs for the same point in time, the master clock 402 and the slave clock 404 have the same clock width. A clock in such a state as the slave clock 404 is will hereinafter be referred to as a "slave clock in a synchronous state." In order for the slave clock to be in a synchronous state, the clock width of the slave clock needs to coincide with that of the master clock. Hereinafter, the operation of a slave clock that is not in synchronization with the master clock according to the TS method will be described with reference to the clock of the slave node that is in a synchronous state (in FIG. 4, written as "slave clock 404").

Suppose that the network is constructed by the TDM method alone without a packet network. In such a case, the network is not fluctuating and the packet 405 that is transmitted from the master node when the TS on the master clock 402 is 55 arrives at the slave node when the TS on the slave clock 404 is also 55. A packet 406 represents a packet that arrives at the TS (55) when the network is assumed to be delay-free. In fact, the amount of delay D (in the example of FIG. 4, the amount of, delay D=4) is added in the packet network between the master and slave, and the packet arrives at timing 59 of the slave clock 404. A packet 407 represents a packet that is passed through the packet network, is given the amount of delay 4, and arrives when the TS on the slave clock 404 is 59. Hereinafter, the value of the time stamp on the clock of the slave node when a packet transmitted from the master node arrives at the slave node will be referred to as the arrival timing of the packet.

As mentioned above, the amount of delay D is typically determined from the difference between the generated TS and the received TS. More specifically, the expressed is: the amount of delay=the generated TS−the received TS (D=Ts−Tm).

In the example of FIG. 4, D=Ts (=59)−Tm (=55)=4. With a threshold Dth =8, the amount of delay D satisfies 0≤D≤Dth, and the TS of the packet is employed. If a packet arrives with D>Dth, the TS of the packet is rejected.

Since the amount of delay D is thus determined from the difference between the received TS and the generated TS and the filter processing is performed based on the condition that includes the threshold Dth, it is possible to perform clock synchronization control by rejecting the TS of packets that have amounts of delay greater than the threshold Dth and selectively employing only the TS of packets that have smaller amounts of delay.

By the method described above with reference to FIG. 4, it is possible to perform clock synchronization control by using the packet filter function. The description of FIG. 4 has dealt with the case where the master clock 402 and the slave clock 404 are in perfect synchronization with each other and the slave clock 404 is in a synchronous state. In fact, it is not the case that the clocks are in perfect synchronization, and rather the goal is to achieve synchronization from a not synchronized situation by means of synchronization control. When the clock of the master node and that of the slave node are not in synchronization with each other, there is the following problem.

FIG. 5 is a diagram showing the timing flow of FIG. 4 to which timing flow is added of the case where the master clock 402 and a clock 501 of the slave node (hereinafter, referred to as "slave clock 501") are not in synchronization with each other, and the slave clock 501 has a clock width smaller than that of the master clock 402 in particular.

In FIG. 5, the slave clock 501 for the case where the slave node is not in synchronization with the master node is added to the time axis 401 of the master node, the master clock 402, the time axis 403 of the slave node, and the slave clock 404 in a synchronous state which are shown in FIG. 4. In the example, the slave clock 501 has a clock width smaller than that of the slave clock 404. The slave node is thus not in synchronization with the master node.

FIG. 5 shows an example where the master node transmits a packet 405 that contains the received TS of Tm=55 to the slave node. If the slave clock were in a synchronous state, the slave node would receive the packet 405 at timing when the TS on the slave clock 404 is 55 as shown as the packet 406. There is thus a difference between the timing when the TS on the slave clock 501 not in a synchronous state is 55 (packet 506) and the timing when the TS on the slave clock 404 in a synchronous state is 55 (packet 406). Next, specific description will be given with reference to FIGS. 4 and 5.

As described in FIG. 4, the generated TS on the slave clock 404 in a synchronous state at the arrival timing of the packet 406 that does not include the amount of delay D has a value Ts=55. The generated TS at the arrival timing of the packet 407 that actually includes the amount of delay D (in the example of FIG. 4, D=4) has a value Ts=59.

While the slave clock 404 is in a synchronous state, the TS on the master clock 402 and the TS on the slave clock 404 at the same point in time are different as mentioned previously. For example, the TSs differ such that the master clock 402 has a TS of 70 when the slave clock 404 has a TS of 67.

Similarly, in FIG. 5, at the time when the TS value on the slave clock 404 in a synchronous state at which the packet is received from the master node is 55 (shown as the packet 406), the TS value on the slave clock 501 that is not in a synchronous state is 64.

Without the amount of delay D, the generated TS coincides with the received TS. The generated TS when the slave clock 404 does not include the amount of delay D (packet 406) is thus Ts=55. This shows that the arrival timing of the packet 506 on the slave clock 501, in terms of TS, has a deviation of 55−64=−9 with respect to the arrival timing of the packet 406 on the slave clock 404. That is, the packet 506 whose generated TS on the slave clock 501 is Ts=55 is shifted by −9 from the packet 406 on the slave clock 404. Such a deviation results from the lack of synchronization of the slave clock 501 with the master clock 402. In the present invention, such a difference of the TS on the clock of the slave node from the TS on the clock' of the slave node that is in a synchronous state will be defined as a "time stamp deviation (hereinafter, referred to as "TS deviation")" and the value will be denoted by Δ. In the foregoing example of FIG. 5, the TS deviation Δ is −9. The inclusion of a TS deviation in the clock of the slave node yields the problem that it is not possible to perform appropriate packet filter processing. Specific description will be given below.

As discussed in FIG. 4, when in a synchronous state, the amount of delay D of the packet 407 is D=Ts−Tm=59−55=4. With a threshold Dth=8, the TS of the packet 407 is employed since 0≤D≤Dth is satisfied.

In contrast, when the master node and the slave node are out of synchronization as in FIG. 5, the generated TS at the arrival timing of the packet 407 arriving at the slave node is Ts=69. It follows that D=Ts−Tm=69−55=14. In the example of FIG. 5 where the threshold Dth is set to be 8, D>Dth holds for the amount of delay D. The amount of delay is determined to be greater than the threshold, and the TS of the packet 407 is rejected. The reason is that the slave clock 501 includes the TS deviation Δ(in this example, Δ=−9) with respect to the slave clock 404, and it is therefore not possible to appropriately determine the amount of delay that the arrival timing of the packet 407 on the slave clock 501 has with respect to the arrival timing of the packet 406 on the slave clock 404. As a result, there occurs the problem that the TS that is supposed to be employed without a delay of the packet arrival is rejected, which results in a failure of appropriate packet filter processing.

That a similar problem can occur when the slave node has a clock width greater than that of the master node will be described with reference to FIG. 6. FIG. 6 is a chart in which the clock of the slave node in FIG. 5, or the slave clock 501, is replaced with a slave clock 601. With the slave clock 601, the slave node is not in synchronization with the master node. The slave clock 601 has a clock width greater than that of the slave clock 404.

On the slave clock 601, where the amount of delay D is included, the generated TS at the arrival timing of the packet 407 is Ts=52. If the packet 406 arrives on the slave clock 404 in a synchronous state where the amount of delay D is assumed not to be included (packet 406, TS=55), the TS on the slave clock 601 not in a synchronous state at the same point in time is 49.

Without the amount of delay D, the generated TS coincides with the received TS. The generated TS on the slave clock 404 therefore is Ts=55. This shows that there is a TS deviation of 55−49=+6 from the arrival timing of the packet 606 on the slave clock 601 to the arrival timing of the packet 406 on the slave clock 404 in terms of TS. That is, the arrival timing of the packet 606 on the slave clock 601 is 55, which is shifted by +6 from the arrival timing of the packet 406 on the slave clock 404. Such a deviation results from the lack of synchronization of the slave clock 601 with the master clock 402. The effect of the deviation on the packet filter will be concretely described below.

As described in FIG. 4, when in a synchronous state, the packet 407 has D=Ts−Tm32 59−55=4. With a threshold Dth=8, the TS of the packet 407 is employed since 0≤D≤Dth is satisfied.

On the other hand, when the master node and the slave node are out of synchronization as in FIG. 6, the generated TS at the arrival timing of the packet 407 is Ts=52. It follows that D=Ts−Tm32 52−55=−3. Since the amount of delay D<0 and does not satisfy 0≤D≤Dth, the TS of the packet 407 is rejected. The reason is that the slave clock 601 includes the TS deviation Δ (in this example, Δ=+6) with respect to the slave clock 404, and it is therefore not possible to appropriately determine the amount of delay that the arrival timing of the packet 407 on the slave clock 601 has with respect to the arrival timing of the packet 406 on the slave clock 404. Consequently, as in the foregoing example of FIG. 5, the TS that is supposed to be employed without a delay of the packet arrival is rejected, which results in a failure of appropriate packet filter processing. As a result, there occurs the problem that it is not possible to synchronize the master clock and the slave clock with each other.

CITATION LIST

Patent Literature

{PTL 1} JP-A-2004-248123
{PTL 2} JP-A-2004-274766
{PTL 3} JP-A-2007-104347

SUMMARY OF INVENTION

Technical Problem

As described above, when the clock of the master node and that of the slave node are not in synchronization with each other, the slave clock inevitably has a TS deviation ☐ with respect to a slave clock that is in a synchronized state. The generated TS (Ts) that is generated at the timing of arrival of a packet at the slave node therefore also includes the TS deviation ☐, which makes it not possible to appropriately calculate the amount of delay on the slave node side. Consequently, there has been the problem that the packet filter processing fails to perform the filter processing of appropriately discarding the TS of packets that exceed a predetermined threshold in the amount of delay, resulting in a failure of synchronization between the master clock and the slave clock.

An object of the present invention is to provide a clock synchronization system, method, apparatus, and program for solving the foregoing problem, i.e., the problem that when the master node transmits packets to the slave node through a packet network and packet filter processing is performed on the slave node, it is not possible to perform the filter processing of appropriately discarding the TS of packets that exceed a predetermined threshold in the amount of delay, resulting in a failure of synchronization between the master clock and the slave clock.

Solution to Problem

A clock synchronization system according to the present invention is a clock synchronization system for synchronizing a clock of a slave node with a clock of a master node. The master node includes a packet transmitting unit that transmits a packet including a time stamp to the slave node. The slave node includes a packet receiving unit, a packet filter unit, and a phase synchronization unit. The packet receiving unit receives the packet transmitted from the master node. The packet filter unit calculates as a value of delay of the packet a difference between a time stamp on the clock of the slave node when the packet is received and the time stamp of the packet received, corrects the value of the delay of the packet or a threshold for the delay of the packet, and performs filter processing on the packet received from the packet receiving unit based on the value of the delay of the packet and the threshold for the delay of the packet. The phase synchronization unit outputs the clock of the slave node based on the time stamp included in the packet that is employed by the packet filter unit A node according to the present invention is a node for synchronizing a clock of the own node with a clock of a master node. The node includes a packet receiving unit, a packet filter unit, and a phase synchronization unit. The packet receiving unit receives a packet including a time stamp from the master node through a network. The packet filter unit calculates as a value of delay of the packet a difference between a time stamp on the clock of the own node when the packet is received and the time stamp of the packet received, corrects the value of the delay of the packet or a threshold for the delay of the packet, and performs filter processing on the packet received from the packet receiving unit based on the value of the delay of the packet and the threshold for the delay of the packet. The phase synchronization unit outputs the clock of the own node based on the time stamp included in the packet that is employed by the packet filter unit.

A clock synchronization method according to the present invention is a clock synchronization method for synchronizing a clock of a slave node with a clock of a master node, and includes a packet receiving step, a delay calculation step, a correction step, and a packet filter step. In the packet receiving step, a packet including a time stamp is received through a network. In the delay calculation step, a difference between a time stamp on the clock of the slave node when the packet is received and the time stamp of the packet received is calculated as a value of delay of the packet. In the correction step, the value of the delay of the packet or a threshold for the delay of the packet is corrected. In the packet filter step, filter processing is performed on the packet received from the packet receiving step based on the value of the delay of the packet and the threshold for the delay of the packet. In the phase synchronization step, the clock of the slave node is output based on the time stamp included in the packet that is employed in the packet filter step.

A program according to the present invention is a program for synchronizing a clock of a slave node with a clock of a master node, and includes packet receiving processing, packet filter processing, and phase synchronization processing. The packet receiving processing brings into practice receiving a packet including a time stamp from the master node through a network. The packet filter processing brings into practice calculating as a value of delay of the packet a difference between a time stamp on the clock of the slave node when the packet is received and the time stamp of the packet received, correcting the value of the delay of the packet or a threshold for the delay of the packet, and performing filter processing based on the value of the delay of the packet and the threshold for the delay of the packet corrected. The phase synchronization processing brings into practice outputting the clock of the slave node based on the time stamp included in the packet that is employed in the packet filter processing.

Advantageous Effects of Invention

According to the present invention, when transmitting packets from a master node to a slave node through a packet network, it is possible to perform the packet filter processing of accurately calculating the amounts of delay of the arriving packets on the slave node side and appropriately discarding the TS of packets that exceed a predetermined threshold in the amount of delay, and achieve synchronization between the master clock and the slave clock.

DESCRIPTION OF EMBODIMENTS

A best mode for carrying out the present invention will be described in detail with reference to the drawings.

<First Exemplary Embodiment>

Hereinafter, a first exemplary embodiment of the present invention will be described.

<Overview of Operation of Exemplary Embodiment>

As described above, when the clock of the master node and that of the slave node are not in synchronization with each other, the clock of the slave node inevitably has a TS deviation □ with respect to a synchronized slave clock. The generated TS (Ts) that is generated at the timing of arrival of a packet at the slave node therefore also includes the TS deviation □, which makes it not possible to appropriately calculate the amount of delay on the slave node side. Consequently, there has been the problem that the packet filter processing fails to perform the filter processing of appropriately discarding the TS of packets that exceed a predetermined threshold in the amount of delay. The basic idea of the present invention for solving such a problem will be described with reference to FIGS. 7 and 8.

The reason for the occurrence of the foregoing problem in the background art is that the TS processing in the slave node is performed based on the timing on the slave clock that includes the TS deviation A, not the synchronized slave clock. The present invention then solves the foregoing problem by correcting the amount of delay that the arrival timing of a packet on the slave clock that not in a synchronous state has with respect to the arrival timing of the packet on the slave clock that is in a synchronous state or a preset threshold for the amount of delay in consideration of the TS deviation Δ of the slave clock that is not in a synchronous state with respect to the slave clock that is in a synchronous state so that the arrival timing of the packet on the slave clock coincides with that of the packet on the slave clock that is in a synchronous state.

Figure 5:
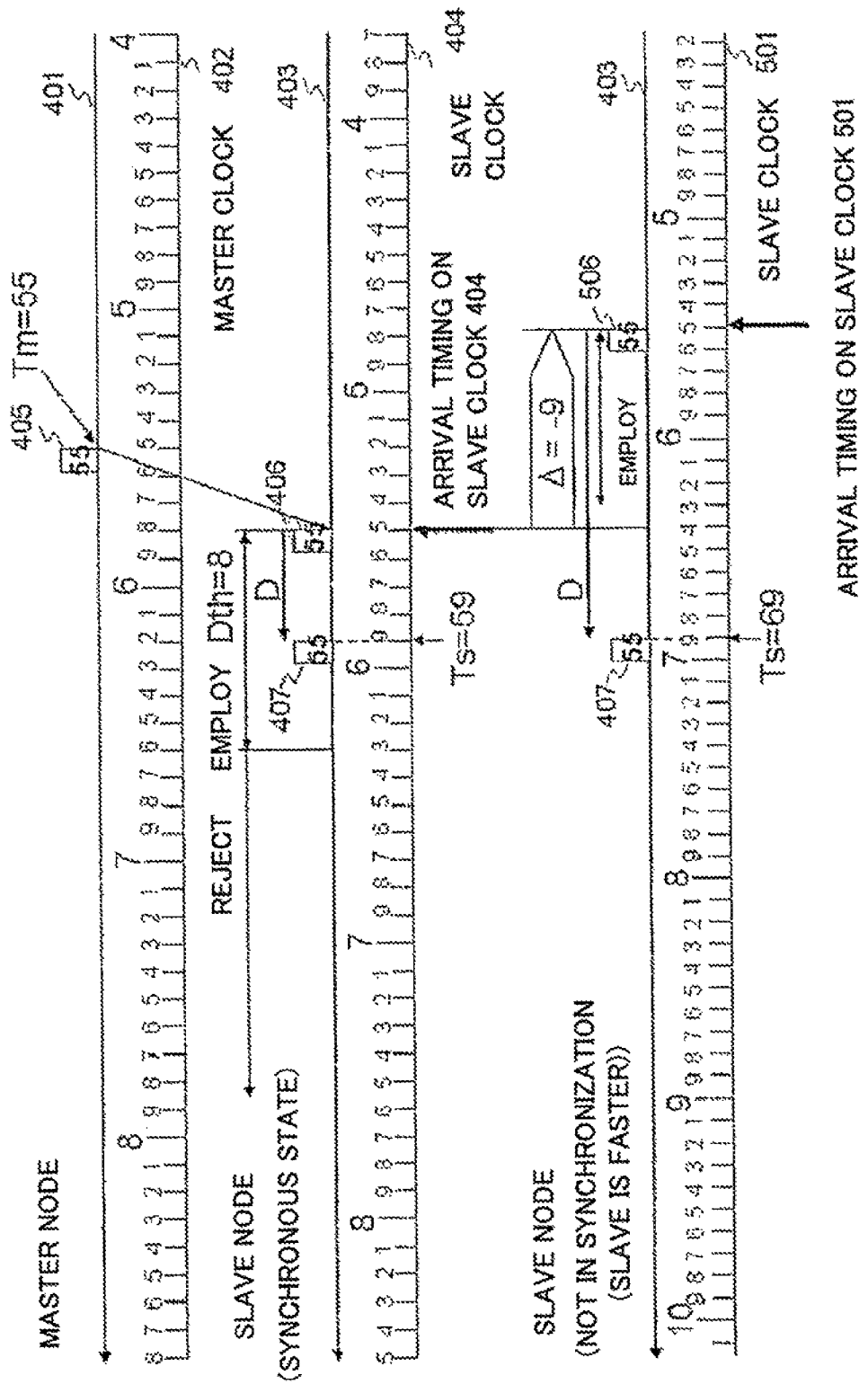
{FIG. 5} A chart showing the clocks of the master node and slave node and the timing of transfer/arrival of packets when the nodes are not in synchronization with each other and the slave node is faster.
Figure 7:
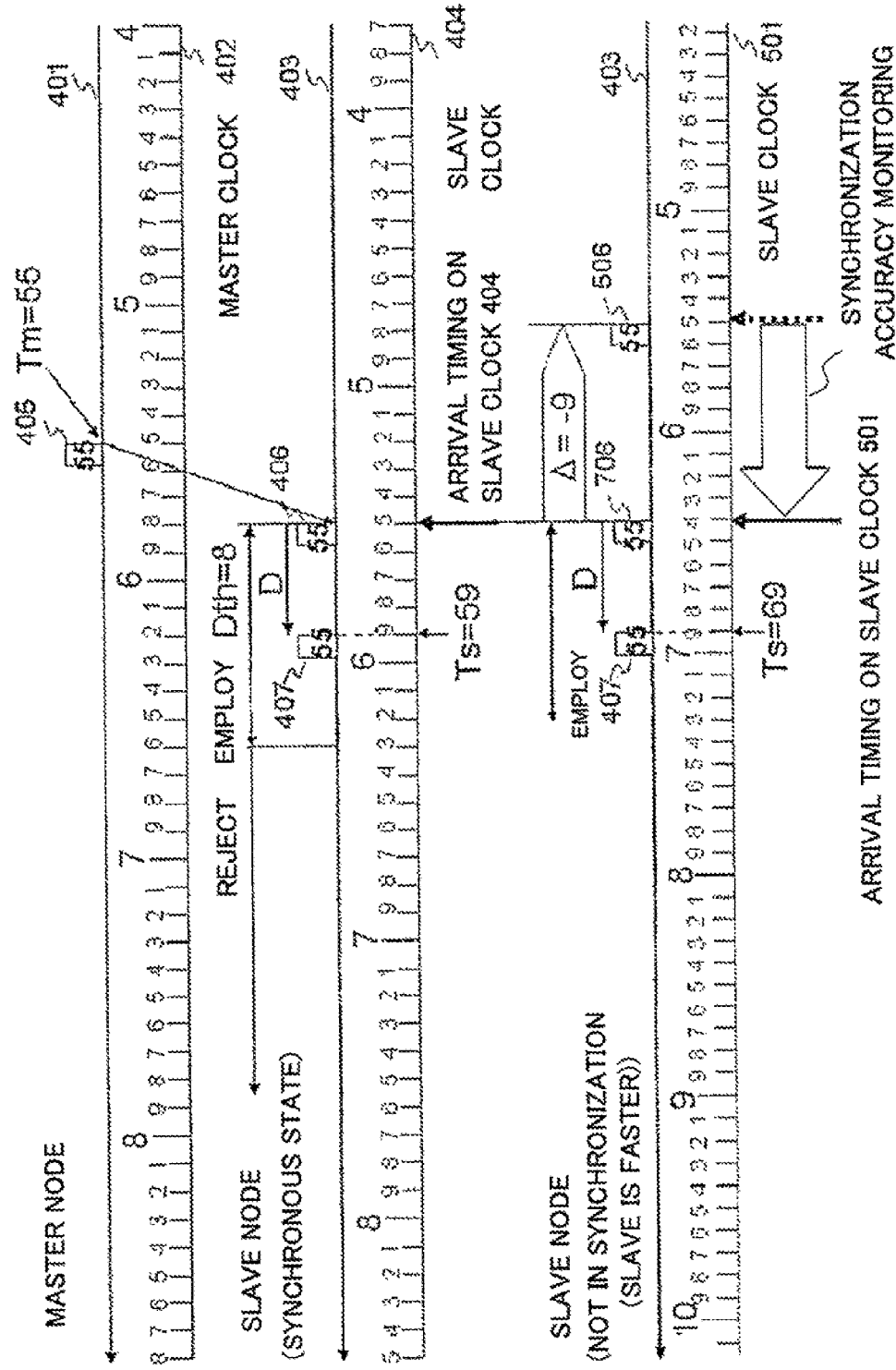
{FIG. 7} A chart showing the clocks of the master node and slave node and the timing of transfer/arrival of packets according to the present invention when the nodes are not in synchronization with each other and the slave node is faster.

A specific description will be given with reference to FIG. 7. Like FIG. 5, FIG. 7 shows an example where the slave clock 501 has a clock width smaller than that of the master clock 402 and the slave node is not in synchronization with the master node. As has been described in FIG. 5, the slave clock 501 has a TS deviation of Δ=−9 with respect to the slave clock 404. The packet 406 has the arrival timing TS=55 on the slave clock 404 that is in a synchronous state. A packet 706 at the same point in time falls on TS=64 on the slave clock 501 that is not in a synchronous state, i.e., with a shift of −9 with respect to the arrival timing of the packet 406.

In the present exemplary embodiment, the TS deviation Δ=−9 is calculated by a synchronization accuracy monitoring function (to be detailed later) or the like, and the arrival timing of the packet 506 on the slave clock 501 is corrected by using the calculated Δ. Specifically, the arrival timing of the packet 506 on the slave clock 501 is shifted by +9 so that the arrival timing coincides with that of the packet 406 on the slave clock 404. As a result, the arrival timing of the packet 506 on the slave clock 501 is corrected from 55 to 64 (the arrival timing of the packet 706). The packet 706 represents a packet that has the same arrival timing as that of the packet 406 on the slave clock 404.

The result of the correction processing may be regarded as a packet (corresponding to the packet 706) arriving from the master node at the same point in time even on the slave clock 501 that is not in a synchronous state as the arrival timing of the packet 406 on the slave clock 404 that is in a synchronous state. After the correction, the filter width Dth can be defined with respect to the arrival timing Ts=64 of the packet 706 on the slave clock 501. This makes it possible to perform the filter processing on the packet with the same filter width as on the slave clock 404.

Figure 6:
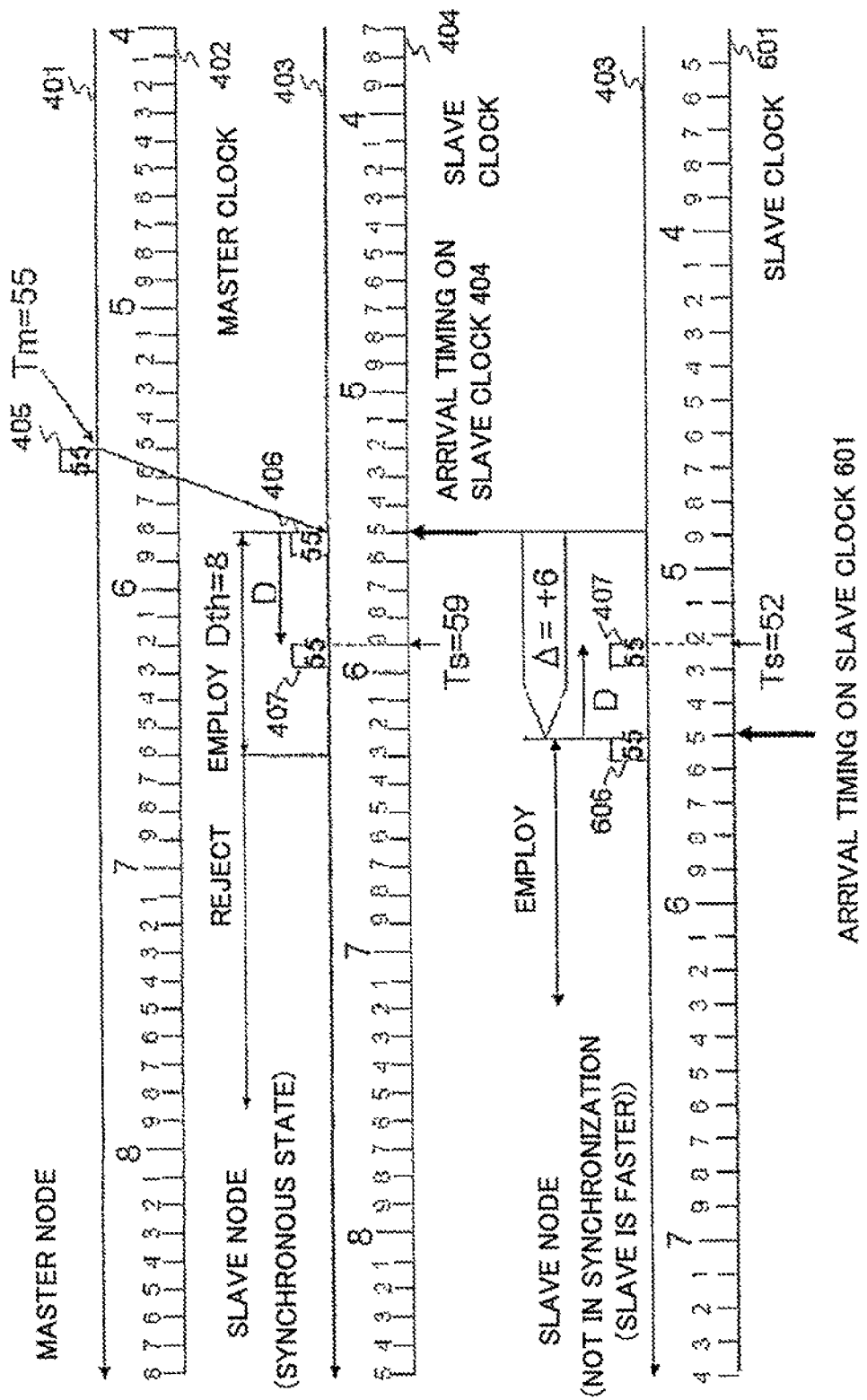
{FIG. 6} A chart showing the clocks of the master node and slave node and the timing of transfer/arrival of packets when the nodes are not in synchronization with each other and the slave node is slower.
Figure 8:
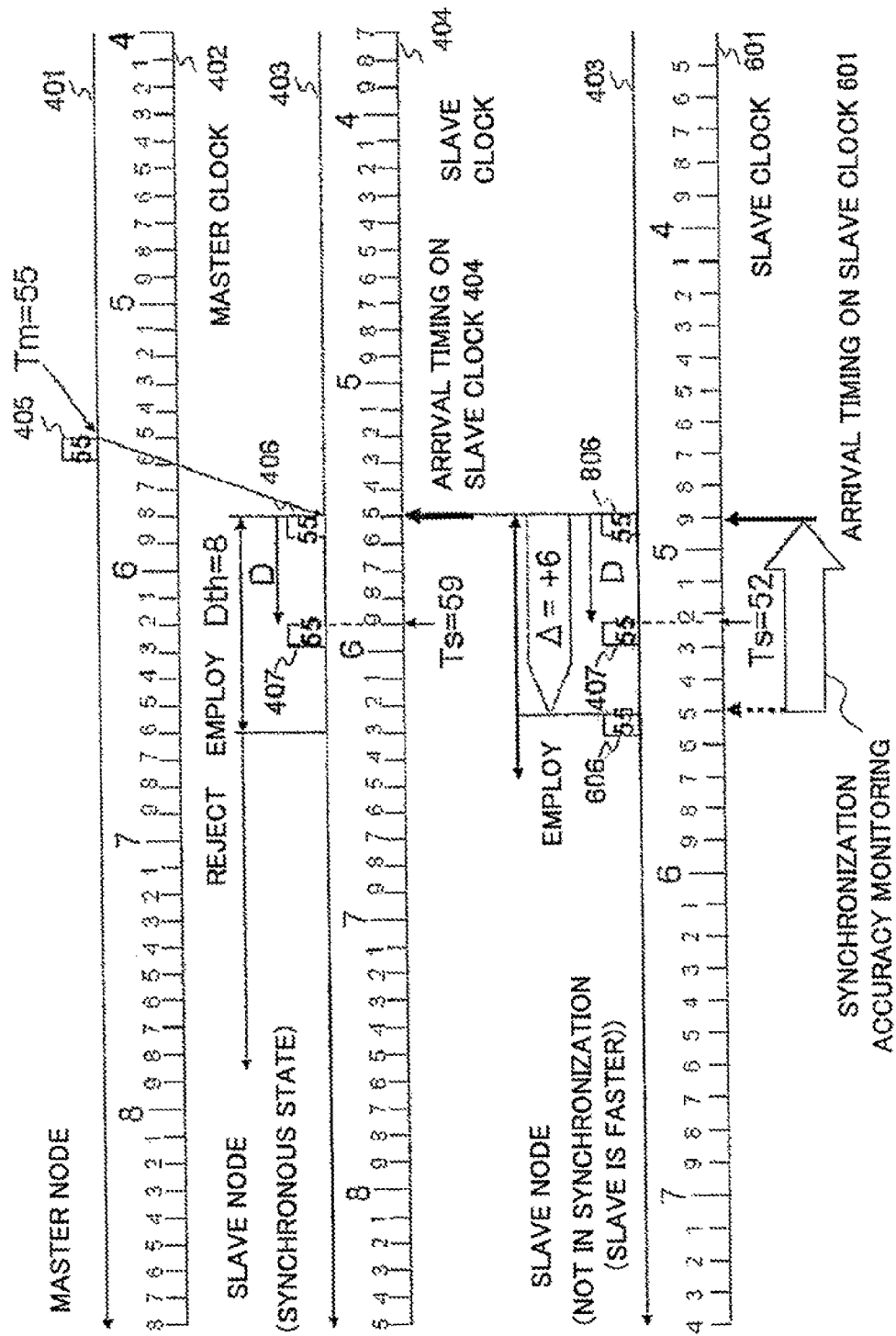
{FIG. 8} A chart showing the clocks of the master node and slave node and the timing of transfer/arrival of packets according to the present invention when the nodes are not in synchronization with each other and the slave node is slower.

Like FIG. 6, FIG. 8 shows an example where the slave node has a clock width greater than that of the master node and the slave node is not in synchronization with the master node. As has been described in FIG. 6, the slave clock 601 has a TS deviation of Δ=+6 with respect to the slave clock 404. The packet 406 has the arrival timing TS=55 on the slave clock 404 that is in a synchronous state. A packet 806 at the same point in time falls on the arrival timing TS=49 on the slave clock 601 that is not in a synchronous state, i.e., with a shift of +6 with respect to the arrival timing of the packet 406.

As in the example of FIG. 7, the TS deviation □=+6 is calculated by the synchronization accuracy monitoring function or the like, and the arrival timing of the packet 606 on the slave clock 601 is corrected by using the calculated □. Specifically, the arrival timing of the packet 606 on the slave clock 601 is shifted by −6 so that the arrival timing coincides with that of the packet 406 on the slave clock 406. As a result, the arrival timing of the packet 606 on the slave clock 601 is corrected from 55 to 49 (the arrival timing of the packet 806). The packet 806 represents a packet that has the same arrival timing as that of the packet 406 on the slave clock 404.

The result of the correction processing may be regarded as a packet (corresponding to the packet 806) arriving from the master node at the same point in time even on the slave clock 601 that is not in a synchronous state as the arrival timing of the packet 406 on the slave clock 404 that is in a synchronous state. After the correction, the filter width Dth can be defined with respect to the arrival timing Ts=49 of the packet 806 on the slave clock 601. This makes it possible to perform the filter processing on the packet with the same filter width as on the slave clock 404.

Hereinafter, the configuration and operation of the network and nodes for implementing the foregoing solution will be described.

<Description of Configuration>

Figure 9:
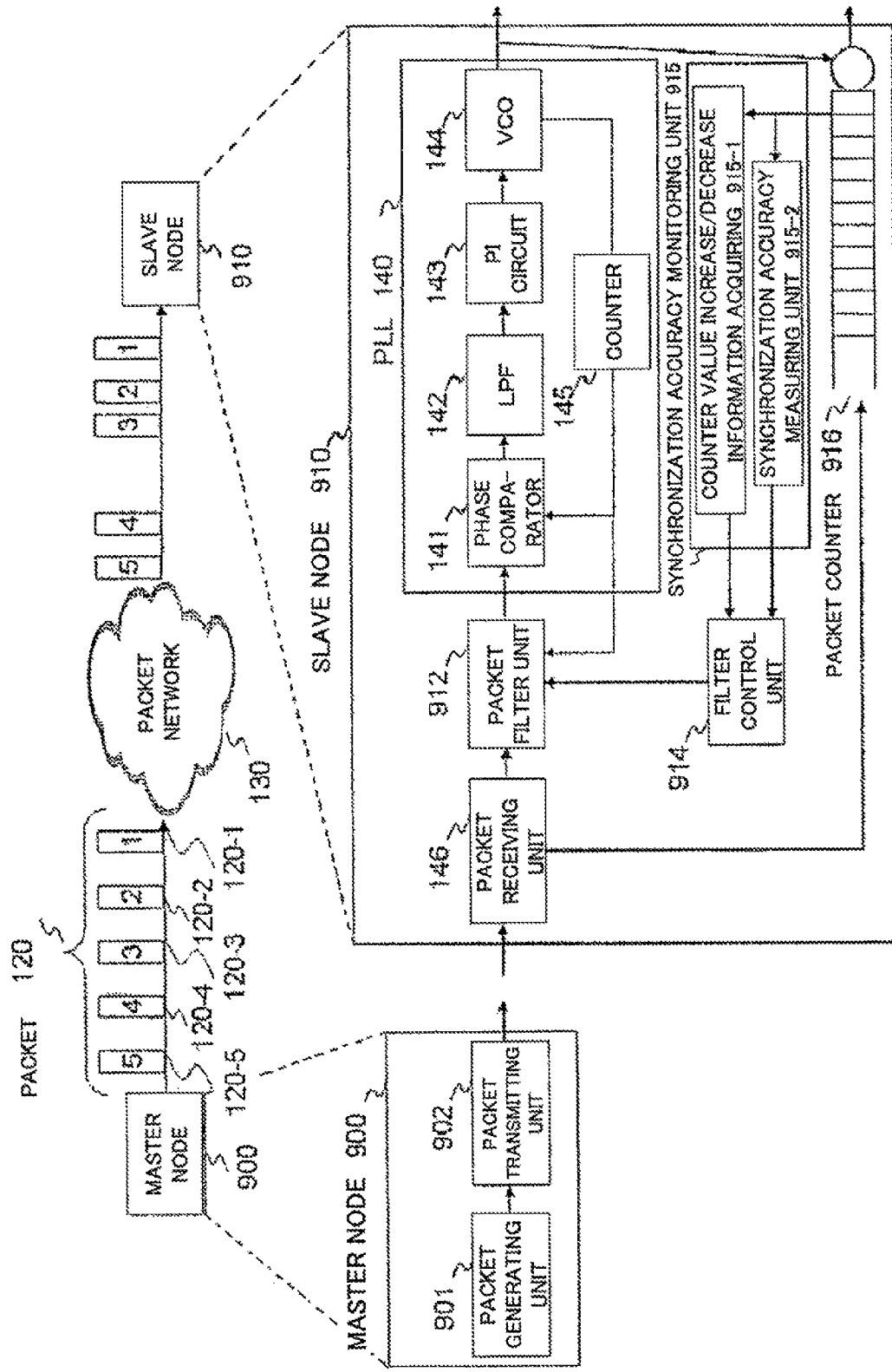
{FIG. 9} A diagram showing the configuration of the master node and the slave node according to an exemplary embodiment of the present invention.

Referring to the upper part of FIG. 9, the overall configuration of the exemplary embodiment of the present invention includes a master node 900, a slave node 910, and a packet network 130. The master node 900 and the slave node 910 have the following configuration.

<Master Node>

The master node 900 includes a packet generating unit 901 and a packet transmitting unit 902. The packet generating unit 901 generates packets 120 that contain TS intended for clock synchronization. The packet transmitting unit 902 transmits the packets 120 generated by the packet generating units 901 to the slave node 910 at regular intervals.

<Slave Node>

The slave node 910 includes a packet receiving unit 146, a packet filter unit 912, a PLL (Phase Locked Loop) 140, a filter control unit 914, a synchronization accuracy monitoring unit 915, and a packet counter 916.

The packet receiving unit 146 receives the packets 120 transferred from the master node 900 through the packet network 130. The received packets 120 are simultaneously sent to the packet filter unit 912 and the packet counter 916 (either one of which receives copies of the packets 120).

The packet filter unit 912 calculates the amount of delay D from a difference between the received TS that is stored in a packet 120 received from the packet receiving unit 146 and the generated TS that is generated by the counter 145. The packet filter unit 912 compares a preset threshold Dth and the amount of delay D to determine whether to employ or discard TS of the received packet 120, and sends the packet 120 to the PLL 140 if its TS is to be employed. The packet filter unit 912 also adjusts the amount of delay D or the threshold Dth according to control information received from the filter control unit 914, thereby exercising more appropriate packet discard processing.

It should be noted that the packet filter unit 912 may be activated at the start of transmission and reception of packets 120 with the master node 600. To reduce the time for stabilization, packets may initially be accepted without activation of the packet filter unit 912, which may be activated after some stabilization. In general, the smaller the number of packets accepted into the PLL 140 is, the longer it takes to stabilize accordingly. When the packet filter unit 912 is activated, packets that have a delay greater than or equal to a certain value are discarded, with a decrease in the number of packets employed. Accepting packets with large delays, however, may fail to provide a sufficient synchronization accuracy as described above. All the packets are therefore accepted without the activation of the packet filter unit 912 until some stabilization. After some stabilization, the packet filter unit 912 is activated to discard packets with large delays. This can reduce the time for stabilization without affecting the synchronization accuracy.

Figure 1:
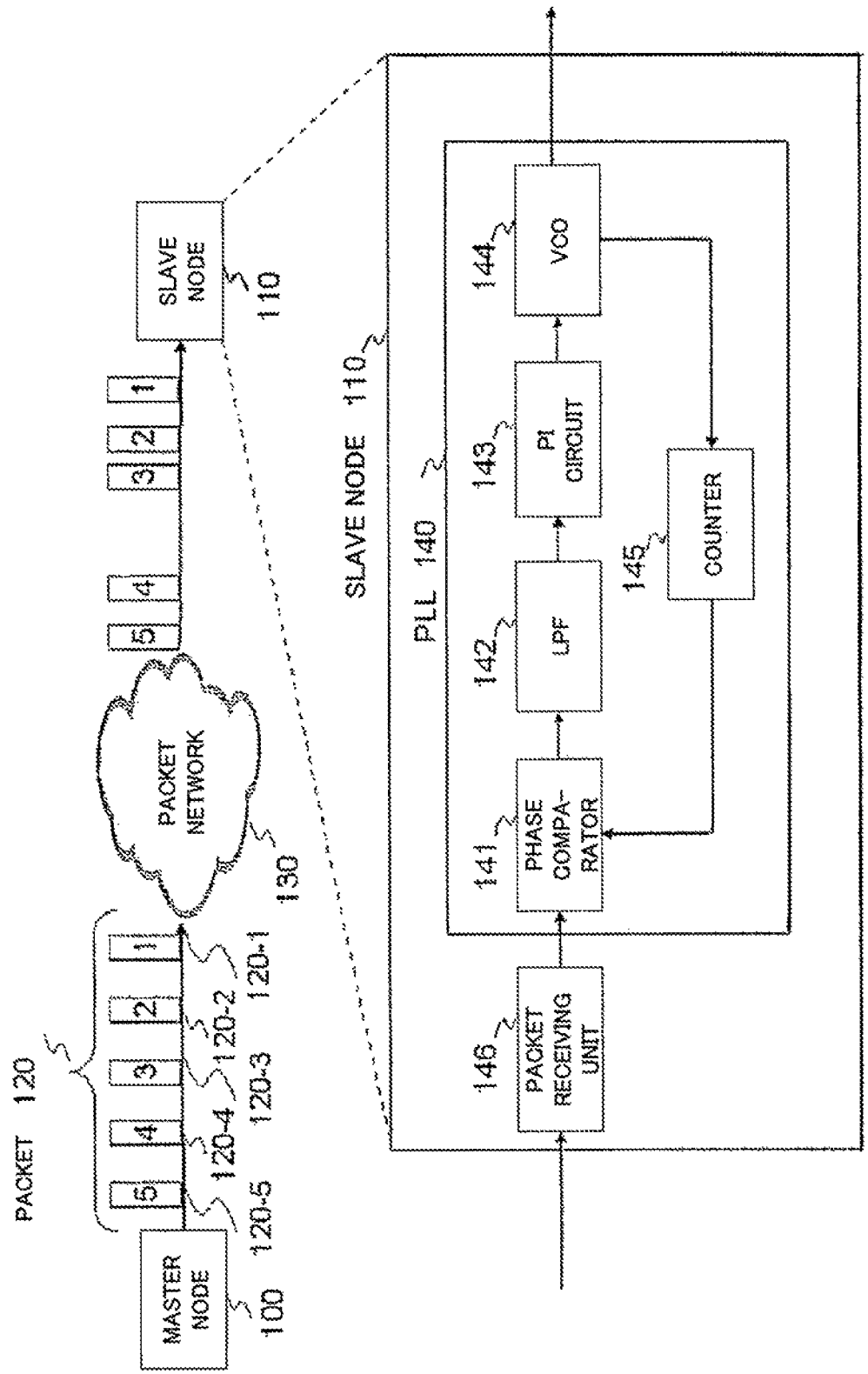
{FIG. 1} A diagram showing a network configuration and the configuration of a slave node when using a time stamp method.
Figure 2:
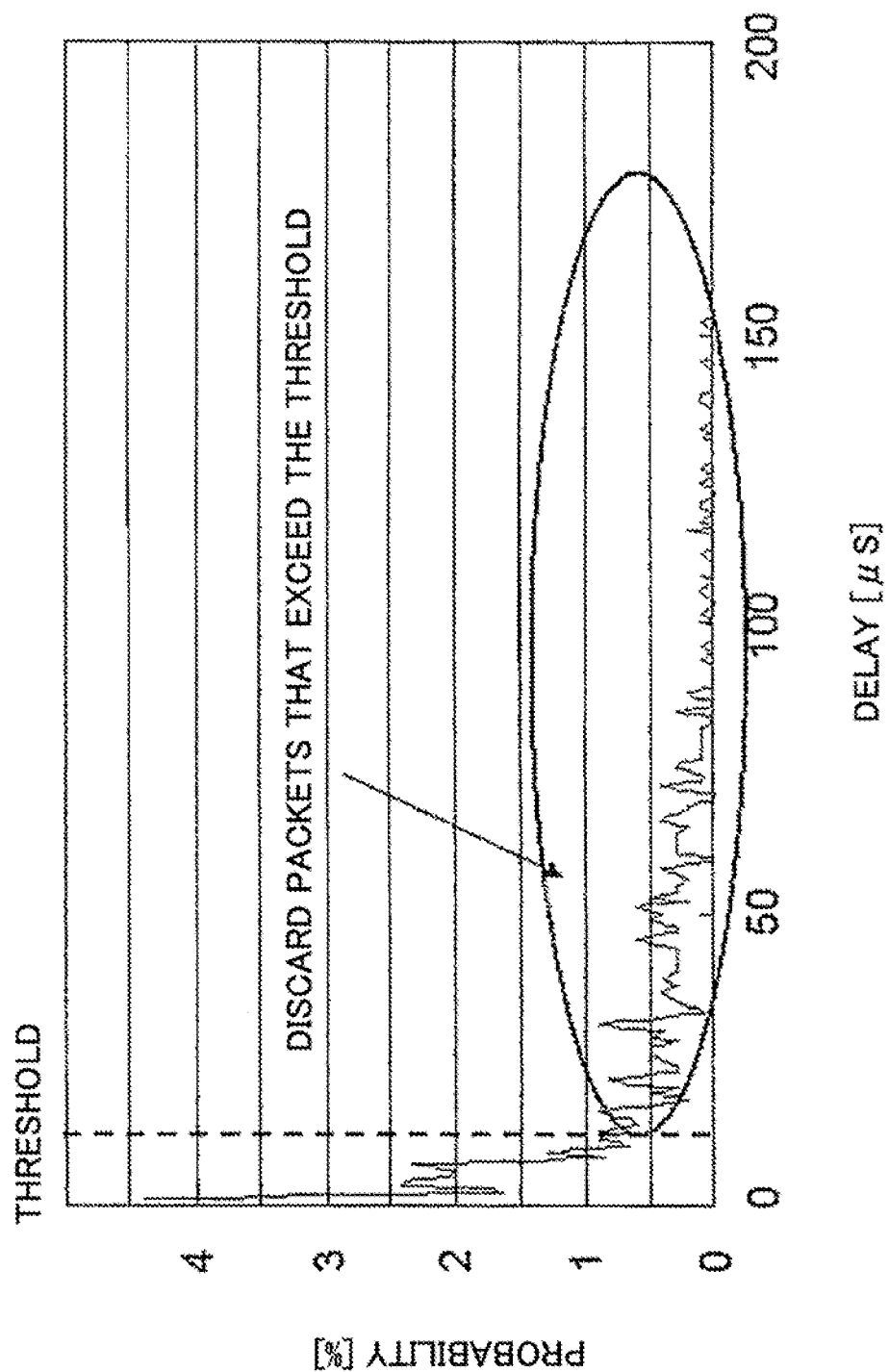
{FIG. 2} A chart showing the probability distribution of delay.

The PLL 140 includes a phase comparator 141, a low pass filter (LPF) 142, a proportion-integration (P1) circuit 143, a voltage control oscillator (VCO) 144, and a counter 145, and has the same configuration as that of the PLL 140 that is included in the slave node of FIG. 1, described in the background art. It will be appreciated that such a configuration is just an example. The configuration is not limited thereto and may be different as long as it is possible to calculate the difference between the TS that is generated from the clock of the slave node 910 itself and the TS that is received from the master node 900 and adjust the clock of the slave node 910 itself based on the difference.

The phase comparator 141 calculates a difference signal between the received TS that is stored in a packet 120 received from the packet filter 912 and TS that is generated by the counter 145, and outputs the difference signal to the LPF 142.

The LPF 142 smoothens the difference signal to suppress jitters and noise, and outputs the resultant to the PI circuit 143.

The PI circuit 143 generates a control signal such that the smoothened difference signal eventually becomes zero, and outputs the control signal to the VCO 144.

The VCO 144 generates a clock having a frequency that is determined by the input control signal, and outputs the clock to the counter 145. According to the clock of the frequency generated, the VCO 144 also decreases the counter value of the packet counter 916.

The counter 145 generates TS based on the clock, and transfers the TS to the phase comparator 141 and the packet filter unit 912.

The packet counter 916 increases its counter value by a predetermined value each time the packet counter 916 receives a packet 120 from the packet receiving unit 146. The packet counter 916 also decreases the counter value according to the frequency determined by the VCO 144. It should be noted that the packet counter 916 may be a packet buffer. Being a packet buffer, the packet counter 916 receives packets 120 from the packet receiving unit 146, accumulates the packets 120, and simultaneously outputs the accumulated packets according to the frequency determined by the VCO 144.

The synchronization accuracy monitoring unit 915 includes a synchronization accuracy measuring unit 915-1 and a counter value increase/decrease information acquiring unit 915-2. The synchronization accuracy measuring unit 915-1 measures the synchronization accuracy between the master node 900 and the slave node 910. The synchronization accuracy may be measured by any method, including a method of using a packet counter to be described later and a method of using an instrument for measuring the synchronization accuracy.

Here, the method of using a packet counter will be described as an example of the method for measuring the synchronization accuracy. The operation of the synchronization accuracy measuring unit 915-1 according to the method will be described below.

Initially, the synchronization accuracy measuring unit 915-1 monitors the counter value of the packet counter 916. The synchronization accuracy measuring unit 915-1 then determines the maximum value Counter_Max[t] of the counter value in an interval t.

Having determined the maximum counter value Counter_Max[t], the synchronization accuracy measuring unit 915-1 then calculates the amount of difference Deviation[t] between the maximum counter value Counter_Max[t] in that interval and a reference counter value Counter_Ref. The equation is given by the following:

Deviation[t]=Counter_Max[t]−Counter_Ref. The amount of difference Deviation[t] shows the amount of change of the foregoing maximum counter value. It should be noted that the reference counter value Counter_Ref refers to the counter value at the start of measurement, a predetermined counter value, or a value that shows both the values.

The counter value increase/decrease information acquiring unit 915-2 monitors the state of increase/decrease of the counter value of the packet counter 916. The synchronization accuracy information and counter value increase/decrease information determined by the synchronization accuracy measuring unit 915-1 and the counter value increase/decrease information acquiring unit 915-2 are then notified to the filter control unit 914.

Based on the synchronization accuracy information received from the synchronization accuracy monitoring unit 915 and the increase/decrease information on the packet counter 916, the filter control unit 914 calculates the TS deviation $\Delta$ for correcting the threshold Dth of the packet filter 912 or the amount of delay D calculated by the packet filter unit 912. The filter control unit 914 notifies the result to the packet filter unit 912. The method of calculating the TS deviation $\Delta$ will be described later.

<Detailed Description of Operation>

As has been described, the present invention is characterized in that the amount of delay that the arrival timing of a packet on the slave clock that is not in a synchronous state has with respect to the arrival timing of the packet on the slave clock that is in a synchronous state or a preset threshold of the amount of delay is corrected in consideration of the TS deviation $\Delta$ of the slave clock that is not in a synchronous state with respect to the slave clock that is in a synchronous state. Subsequently, the arrival timing of the packet on the slave clock is adjusted to the arrival timing on the slave clock that is in a synchronous state, so that the filter processing on the TS of the packet is performed at the same timing as the arrival timing of the packet on the slave clock that is in a synchronous state. The operation of the components of FIG. 9, or the packet filter unit 912, filter control unit 914, and synchronization accuracy monitoring unit 915 in particular, is the key to the implementation. Hereinafter, the operation of the components will be described with emphasis on the operation of the filter control unit 914.

Figure 10:
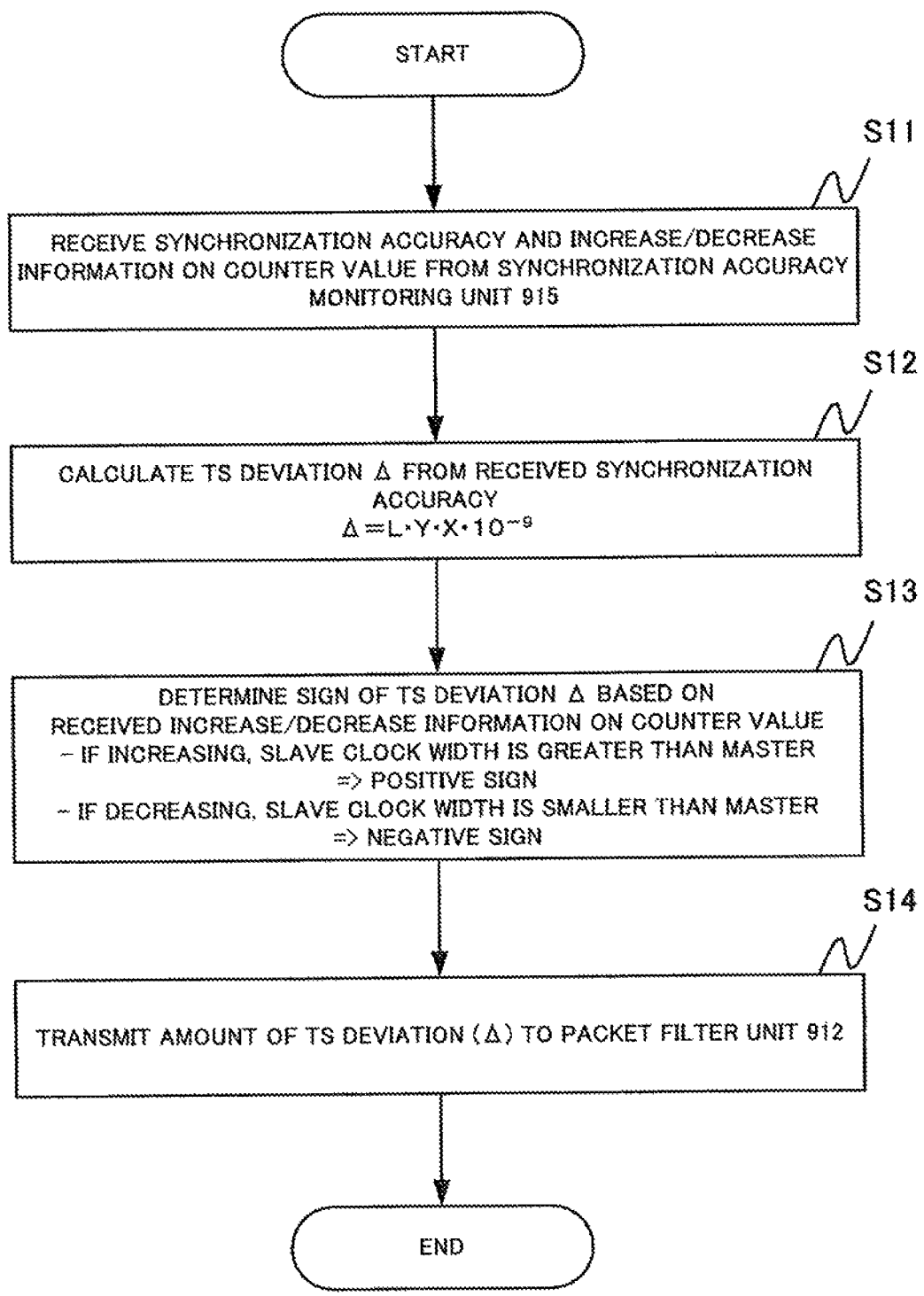
{FIG. 10} A chart showing the processing procedure of a filter control unit 914 according to the present invention.

FIG. 10 shows the processing procedure of the filter control unit 914. In step S11, the filter control unit 914 receives the synchronization accuracy information on between the master and slave nodes from the synchronization accuracy monitoring unit 915 at predetermined intervals. The filter control unit 914 also receives the increase/decrease information on the counter value of the packet counter 916.

As mentioned previously, the method by which the synchronization accuracy measuring unit 915-1 of the synchronization accuracy monitoring unit 915 acquires the synchronization accuracy information is not limited in particular. As for the method by which the counter value increase/decrease information acquiring unit 915-2 acquires the increase/decrease information on the counter value, an example will be given later.

The filter control unit 914 initially receives the synchronization accuracy and the increase/decrease information on the counter value as described above (step S11). Next, in step S12, the filter control unit 914 calculates the TS deviation $\Delta$ from the synchronization accuracy received.

Suppose that the synchronization accuracy acquired by the synchronization accuracy measuring unit 915-1 is X ppb. It follows that there is a deviation of X ppb with respect to L×Y (TS), where L (TS) is the predetermined time stamp value to proceed on the clock of the master node per 1 sec, and Y is the predetermined interval (sec) at which the synchronization accuracy is calculated. The TS deviation can thus be expressed by the following equation:

$$\Delta = L \cdot Y \cdot X \cdot 10^{-9}. \quad \text{[Eq. 1]}$$

Having calculated the TS deviation $\Delta$ in step S12, the filter control unit 914 then determines the sign of the TS deviation $\Delta$ from the increase/decrease information on the counter value received in step S11 in the manner described in paragraphs (1) and (2) below (step S13). The paragraphs (1) and (2) will be detailed later.
(1) If the counter value is increased from in the previous measurement of the synchronization accuracy, the clock of the slave node has a clock width greater than that of the clock of the master node. In such a case, Δ is given a positive sign so that the TS deviation is +Δ.
(2) If the counter value is decreased from in the previous measurement of the synchronization accuracy, the clock of the slave node has a clock width smaller than that of the clock of the master node. In such a case, Δ is given a negative sign so that the TS deviation is −Δ.

Having determined the sign of the TS deviation Δ in step S13, the filter control unit 914 finally transmits the amount of TS deviation +Δ or −Δ to the packet filter unit 912 in step S14.

Next, the packet filter unit 912 will be described. As has been described in the section of the background art, the packet filter unit 350 shown in FIG. 3 performs the filter processing on packets under the condition that 0≤D≤Dth.

Figure 3:
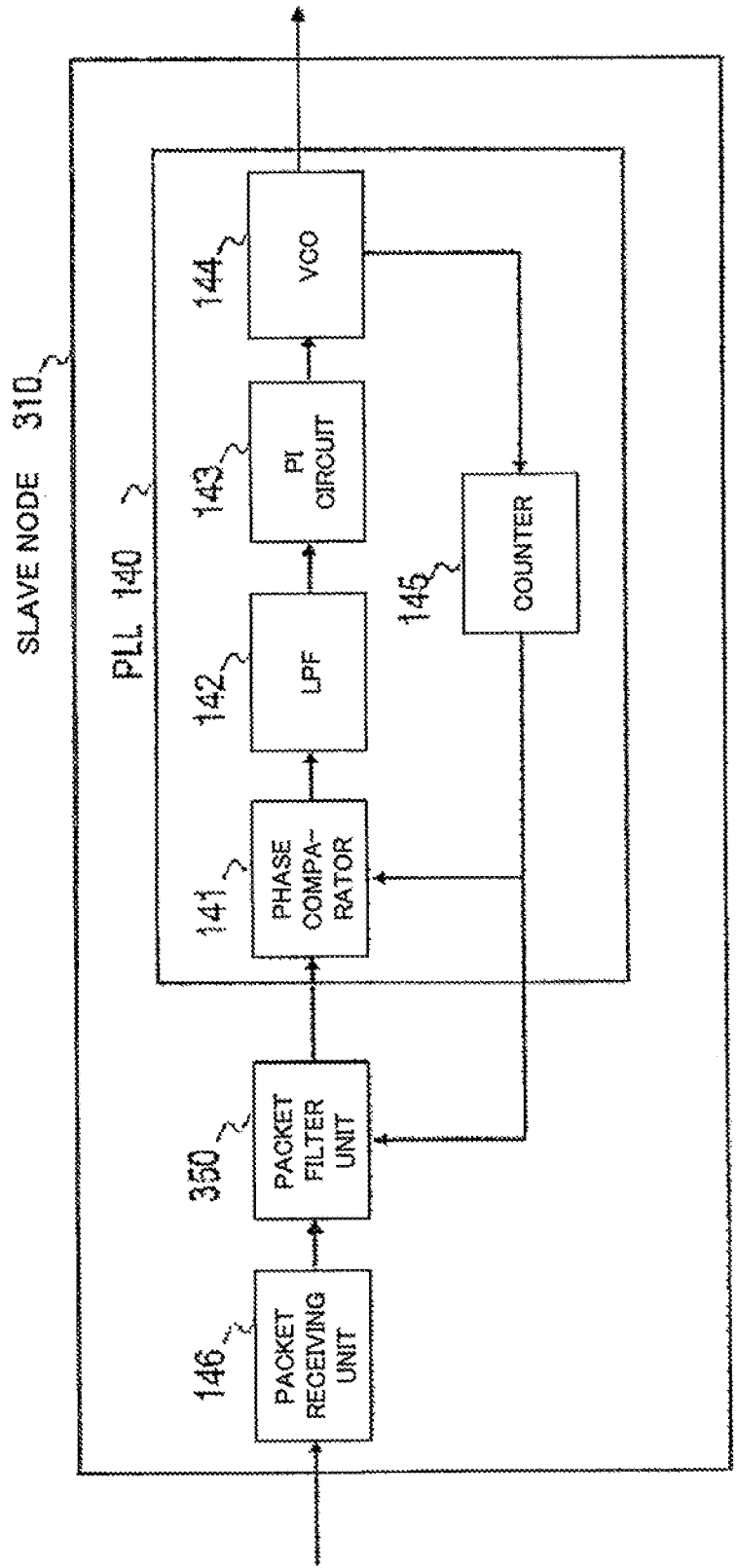
{FIG. 3} A diagram showing the configuration of the slave node when using a packet filter function.
Figure 4:
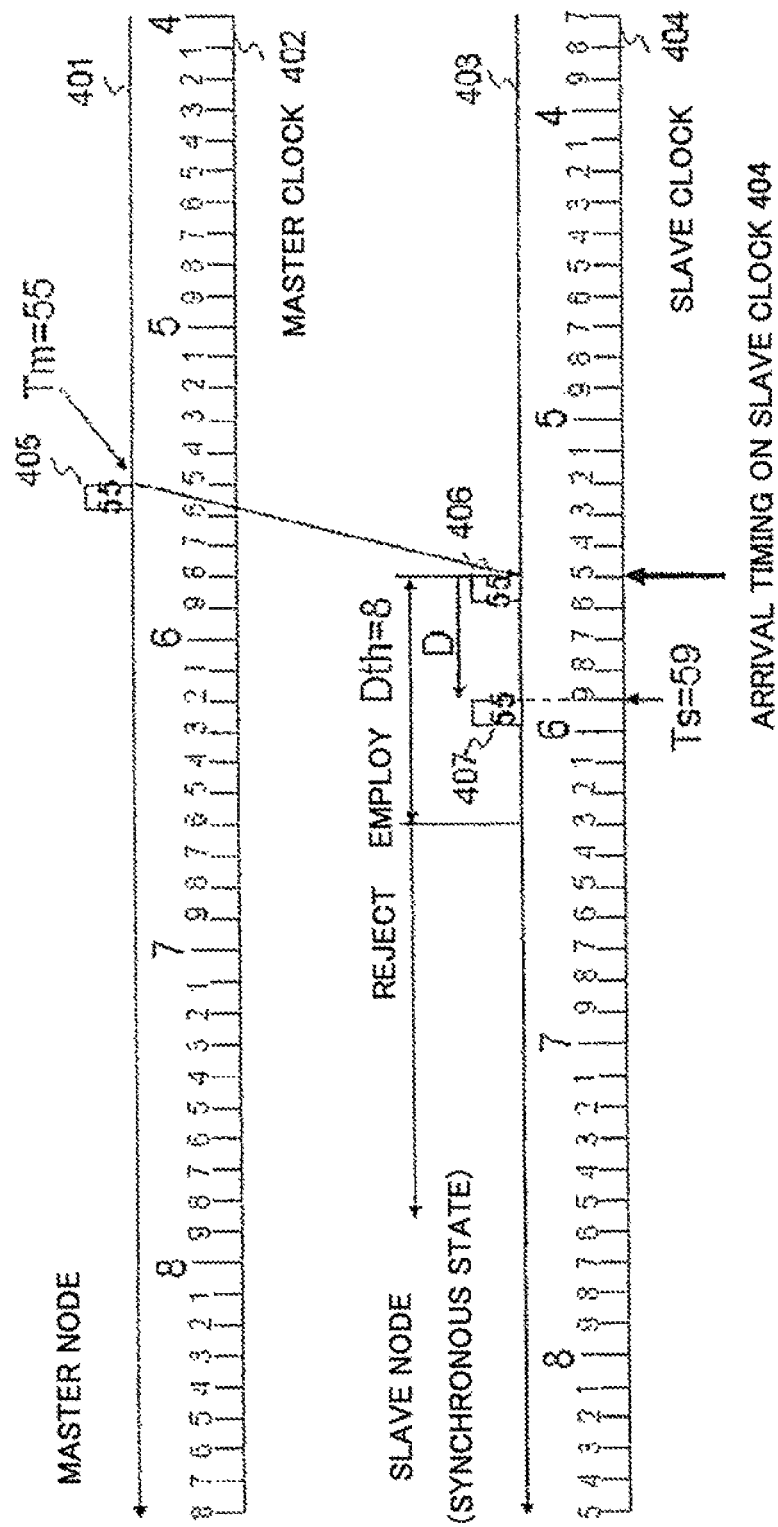
{FIG. 4} A chart showing the clocks of the master node and slave node and the timing of transfer/arrival of packets when the nodes are in synchronization with each other.

Unlike the packet filter unit 350 of FIG. 3, the packet filter unit 912 according to the present invention corrects the TS of the packet received from the master node by using the TS deviation Δ received from the filter control unit 914. For the method of correction, the present invention proposes two methods, including a method of correcting the amount of delay D and a method of correcting the delay threshold Dth. In the present exemplary embodiment, the method of correcting the amount of delay D will be described.

Figure 18:
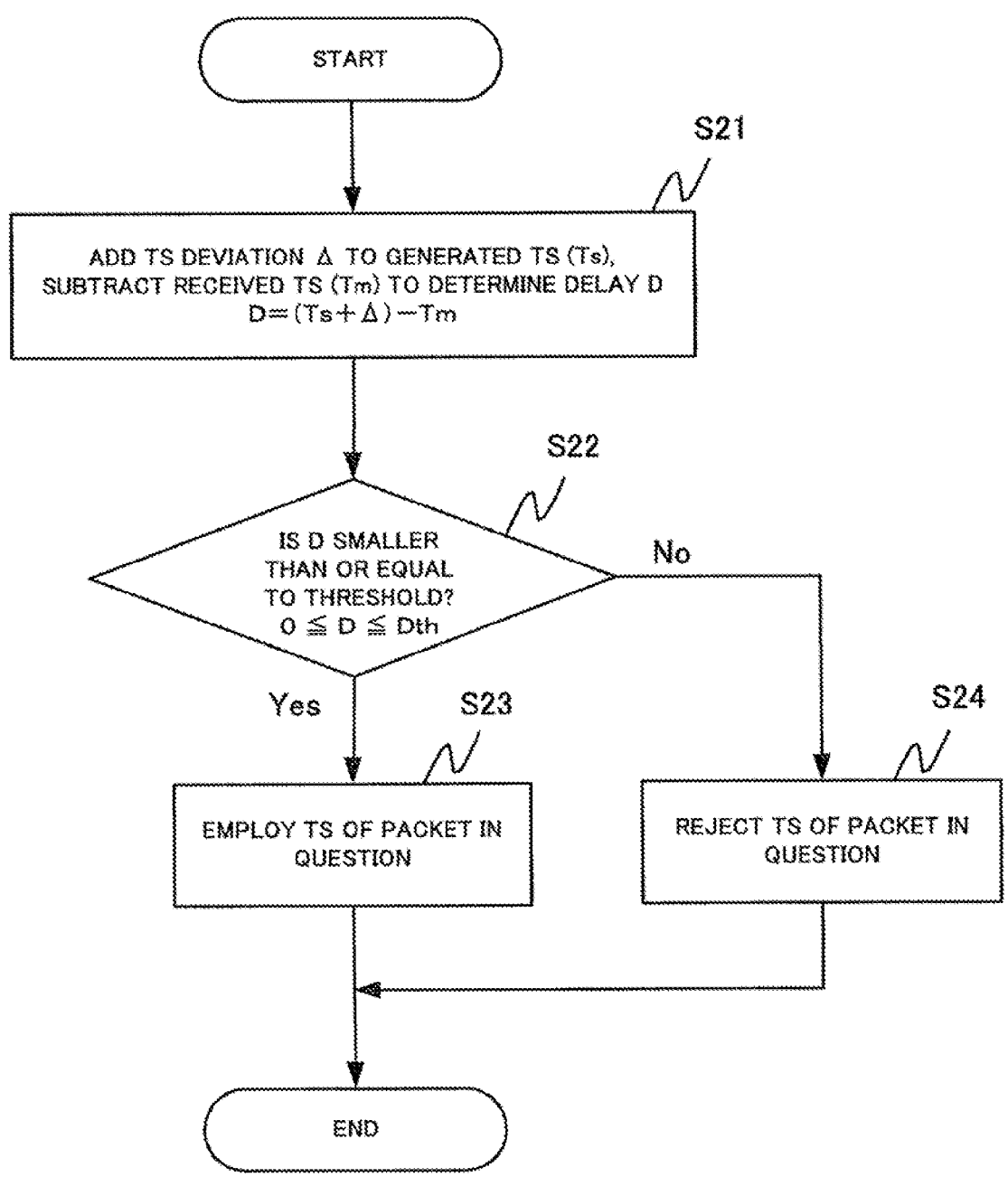
{FIG. 18} A flowchart for the case of using a method of correcting a delay according to a first exemplary embodiment of the present invention.

The correction method according to the present exemplary embodiment is the method of correcting the amount of delay D. FIG. 18 shows a flowchart of the method.

In step S21, the packet filter unit 912 initially adds the TS deviation Δ to the generates TS (Ts) to determine the amount of delay D in consideration of the TS deviation. The equation is as follows:

$$D=(Ts+\Delta)-Tm.$$

Next, the packet filter unit 912 determines whether the amount of delay D determined in step S21 is greater than or equal to 0 and smaller than or equal to the threshold Dth (step S22).

If the amount of delay D is greater than or equal to 0 and smaller than or equal to the threshold (Yes at step S22), the packet filter unit 912 proceeds to step S23 to perform the processing of employing the TS of the packet. On the other hand, if the amount of delay D does not satisfy the condition of step S22 (No at step S22), the packet filter unit 912 proceeds to step S24 to perform the processing of rejecting the TS of the packet.

In the example of FIG. 7, according to step S12 of FIG. 10, the slave clock 501 has a clock width smaller than that of the master clock 402. The TS value of the slave clock 501 is accordingly greater than that of the master clock 402 at the same point in time. The sign of Δ is thus negative. The TS deviation is −Δ(=−9). From the equation of step S21, the corrected amount of delay D of the packet 506 is thus given by: D=(69−9)−55=5. Since the condition of step S22, i.e., 0≤D≤ the threshold Dth=8 is satisfied, the TS of the packet 506 is employed according to step S23. A typical method would result in D=69−55=14, which is greater than the threshold Dth=8 and the TS of the packet 506 would be rejected according to step S24. It can thus be seen that the correction according to the present exemplary embodiment allows appropriate filter processing.

Similarly, in the example of FIG. 8, according to step S12 of FIG. 10, the slave clock 601 has a clock width greater than that of the master clock 402. The TS value of the slave clock 601 is accordingly smaller than that of the master clock 402 at the same point in time. The sign of Δ is thus positive. The TS deviation is +Δ(=+6). From the equation of step S21, the corrected amount of delay D of the packet 606 is thus given by: D=(52+6)−55=3. Since the condition of step S22, i.e., 0≤D≤ the threshold Dth=8 is satisfied, the TS of the packet 606 is employed according to step S23. A typical method would result in D=52−55=−3, which is smaller than the threshold of 0 and the TS of the packet 606 would be rejected according to step S24. It can thus be seen that the correction according to the present exemplary embodiment allows appropriate filter processing.

In summary, the correction method according to the present exemplary embodiment is the method of correcting the amount of delay D. For the filtering condition, the TS of the packet shall be employed when the following condition is satisfied: 0≤(Ts+Δ)−Tm≤Dth. The configuration of the packet filter unit 912 for implementing the foregoing correction method will be described.

Figure 11:
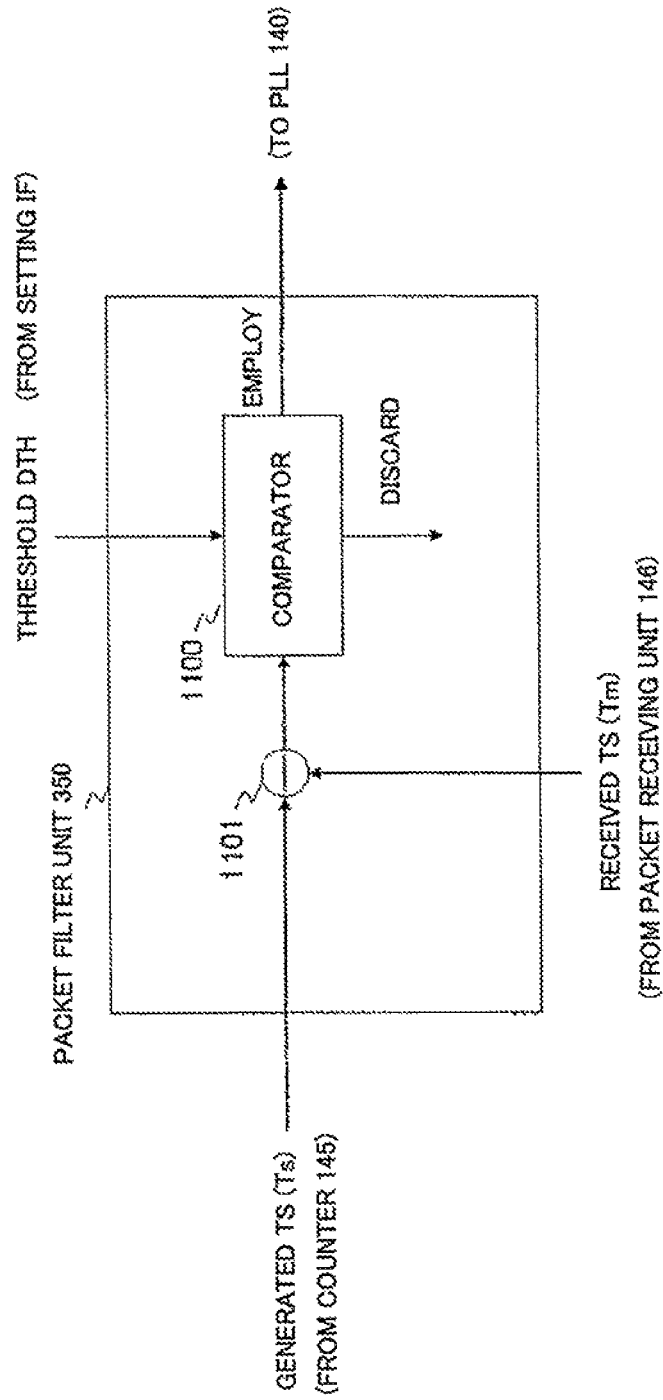
{FIG. 11} An example of a detailed block diagram of a typical packet filter unit 350.

For the sake of comparison, the configuration of the typical packet filter unit 350 will initially be shown in FIG. 11. The packet filter unit 350 includes a subtractor 1101 and a comparator 1100. In the subtractor 1101, a difference between the generated TS (Ts) input from the counter 145 and the received TS (Tm) input from the master node 100 is calculated. The difference is input to the comparator 1100. The comparator 1100 performs a comparison calculatidn according to filtering conditions (1) to (3) seen below, which include the threshold Dth set from a setting interface (hereinafter, referred to as a "setting IF") and the difference information Ts−Tm, and performs filter processing according to the filtering condition to which the TS of the packet corresponds. An example of the setting IF is a GUI (Graphical User Interface) based interface for making various settings on the slave node, such as the interval for calculating the synchronization accuracy and the threshold Dth.

$$0 \leq (Ts-Tm) \leq Dth \quad (1)$$

→Employ the TS of the packet, transfer the TS to the PLL 140.

$$Ts-Tm<0 \quad (2)$$

→Reject the TS of the packet.

$$<Ts-Tm \quad (3)$$

→Reject the TS of the packet.

Figure 12:
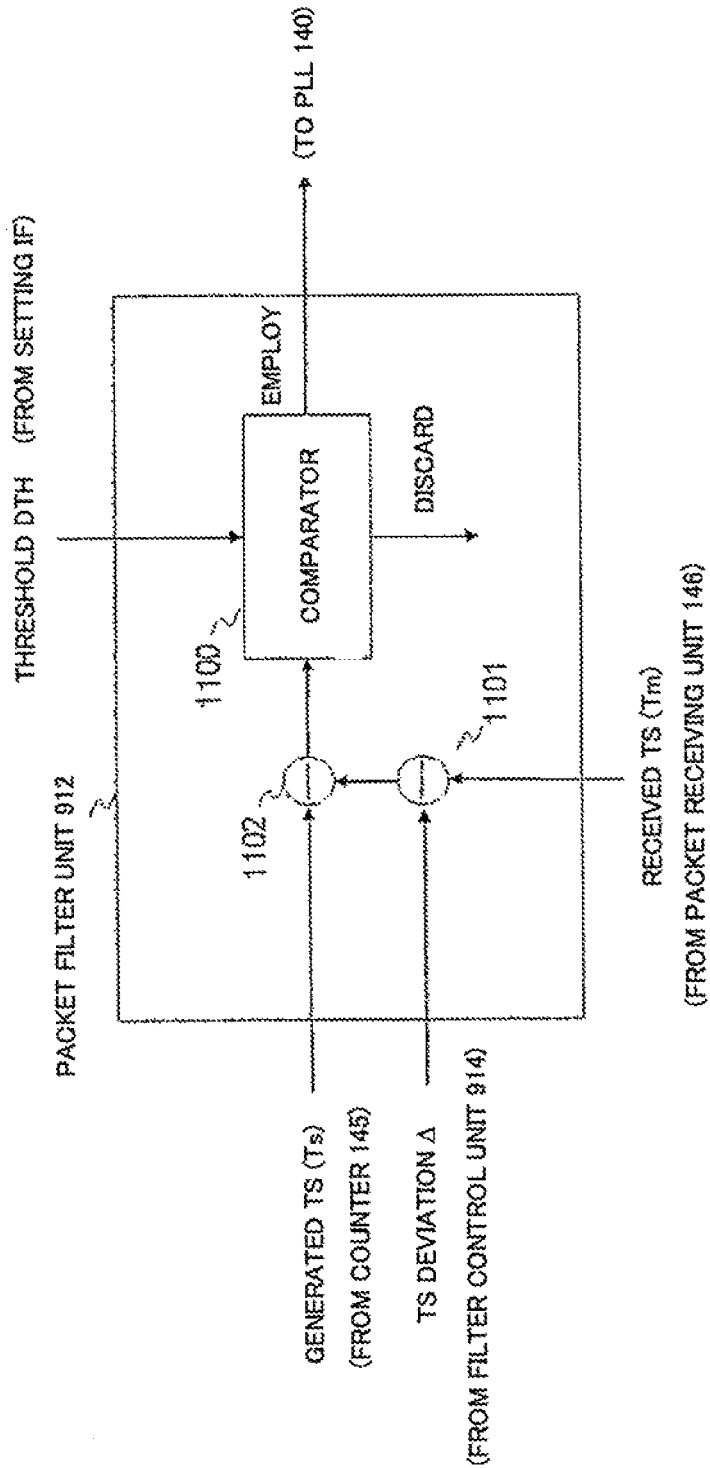
{FIG. 12} An example of a detailed block diagram of a packet filter unit 912 when using a first method of correction of the present invention.

Now, FIG. 12 shows the configuration of the packet filter unit 912 for the foregoing correction method. The packet filter unit 912 includes a subtractor 1101, a comparator 1100, and an adder 1200. A difference from the packet filter unit 350 lies in that the adder 1200 adds the TS deviation Δ received from the filter control unit 914 to the generated TS (Ts). The generated TS is corrected by such processing. The addition information (Ts+Δ) is input to the subtractor 1101. A difference between the addition information (Ts+Δ) and the received TS (Tm) input from the master node 100 is calculated and input to the comparator 1100. The comparator 1100 performs a comparison calculation according to filtering conditions (1) to (3) seen below, which include the threshold Dth set from the setting IF and the difference information (Ts+Δ)−Tm, and performs filter processing according to the filtering condition to which the TS of the packet corresponds.

$$0 \leq (Ts+\Delta)-Tm \leq Dth \quad (1)$$

→Employ the TS of the packet, transfer the TS to the PLL 140.

$$(Ts+\Delta)-Tm<0 \quad (2)$$

→Reject the TS of the packet.

$$Dth<(Ts+\Delta)-Tm \quad (3)$$

→Reject the TS of the packet.

Finally, the method by which the counter value increase/decrease information acquiring unit 915-2 acquires the increase/decrease information on the counter value of the packet counter 916 will be described in conjunction with two examples. As mentioned above, the acquisition methods described below are just a few examples. Any method may be used to acquire the increase/decrease information on the counter value.

<Method of Acquiring Counter Value Increase/Decrease Information: First Method>

The simplest method is to acquire the counter value of the packet counter 916 at the timing of acquisition of the synchronization accuracy information by the synchronization accuracy monitoring unit 916 and compare the acquired counter value with the previous one. As an application example, counter values may be averaged over an interval of the acquisition timing of the synchronization accuracy information, and the average may be compared with the previous one. Using such methods, the increase/decrease information on the counter value can be determined to obtain information on the relationship in the magnitude of the width between the master clock and the slave clock. It will be appreciated that the relationship in the magnitude of the clock width between the master clock and the slave clock may be considered in terms of the relationship in the magnitude of the clock speed between the master clock and the slave clock. In such a case, the difference in clock width may be regarded as a difference in clock speed.

<Method of Acquiring Counter Value Increase/Decrease Information: Second Method>

If the counter value increase/decrease information acquiring unit 915-1 of FIG. 9 uses the foregoing first method to acquire the counter value increase/decrease information, there occurs the problem that the increase or decrease of the counter value sometimes fails to accurately represent the difference in clock width due to the influence of delays that are added while the packets 120 are transferred through the packet network 130. Then, a method less susceptible to delays will be described, along with the foregoing problem of the first method.

Figure 14:
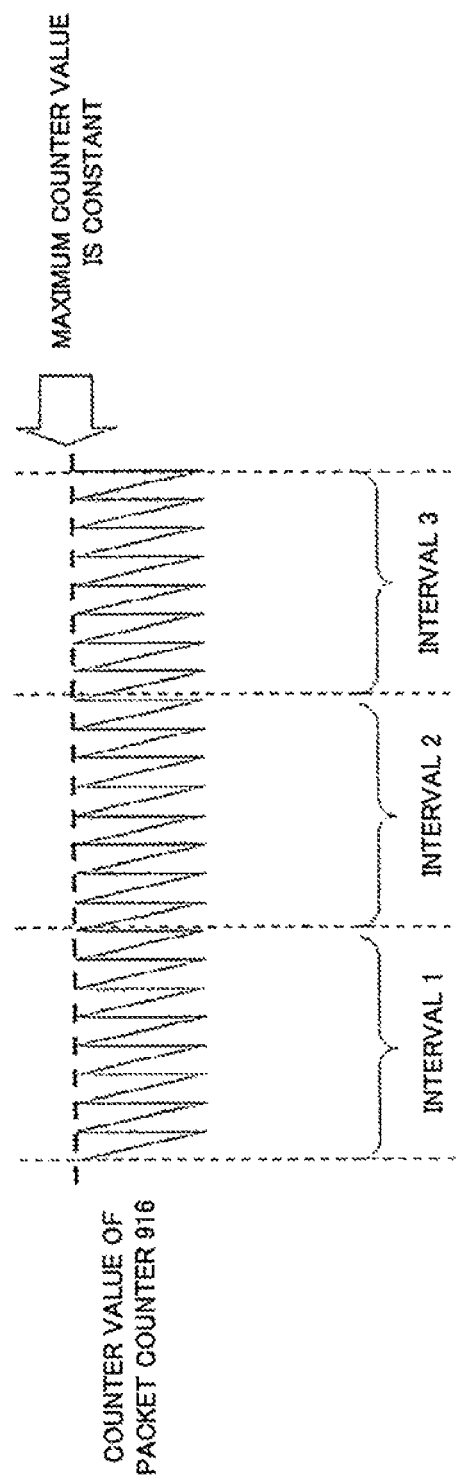
{FIG. 14} A diagram showing the counter value of a packet counter 916 when the clock of the slave node is in synchronization with that of the master node and the packet network has no delay.

FIG. 14 shows the counter value of the packet counter 916 when the clock of the slave node is in exact synchronization with that of the master node and the amount of delay to be added to packets in the packet network is always 0. The direction of the horizontal axis shows the elapsed time, and the direction of the vertical axis the counter value.

Figure 15:
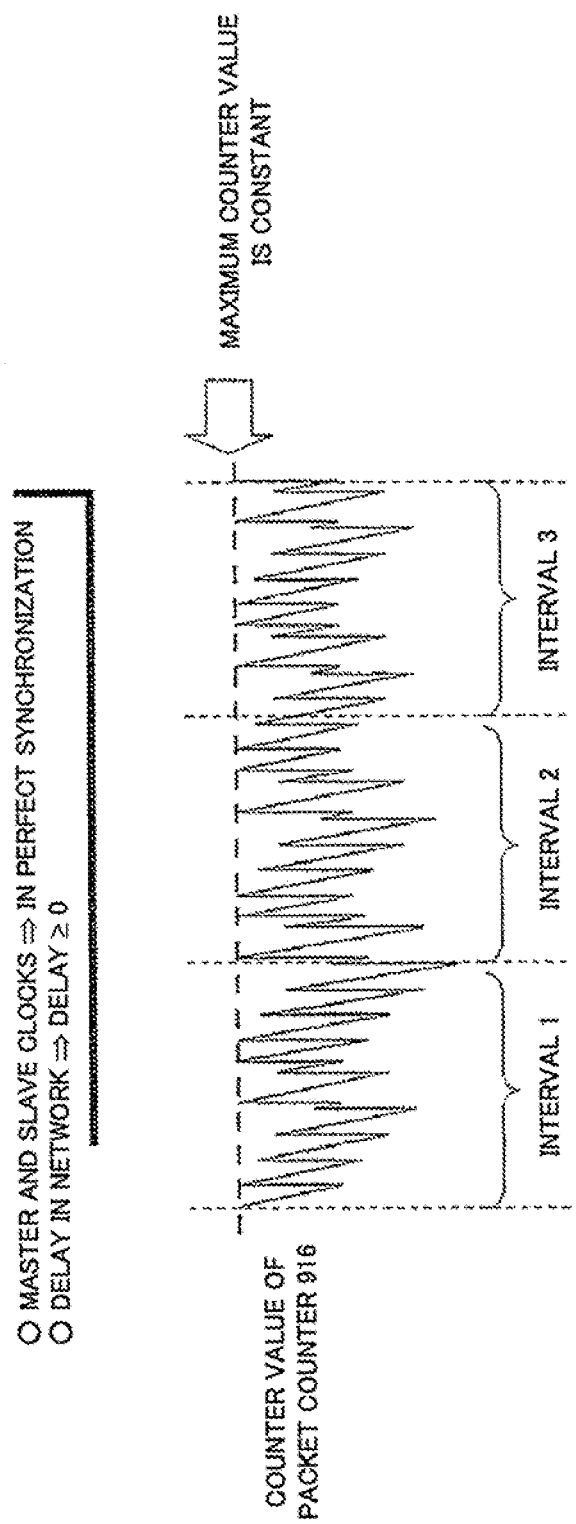
{FIG. 15} A diagram showing the counter value of the packet counter 916 when the clock of the slave node is in synchronization with that of the master node and the packet network has a delay.

FIG. 15 shows the counter value when the slave clock is in exact synchronization with the master clock and there are delays added to packets in the packet network.

Figure 16:
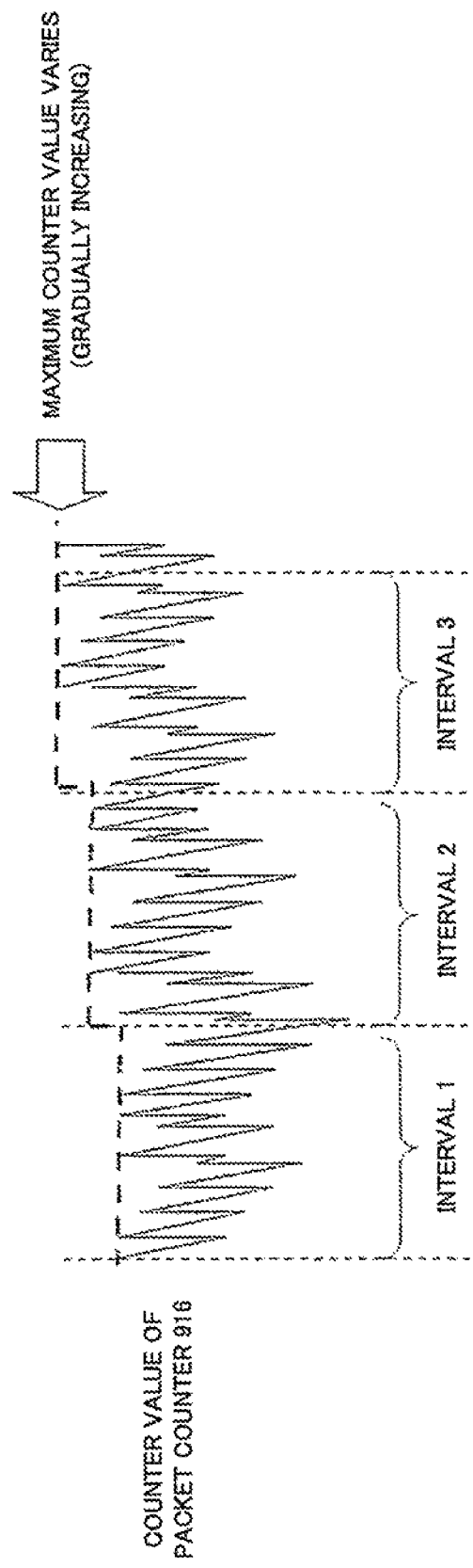
{FIG. 16} A diagram showing the counter value of the packet counter 916 when the clock of the slave node lags behind that of the master node and the packet network has a delay.
Figure 17:
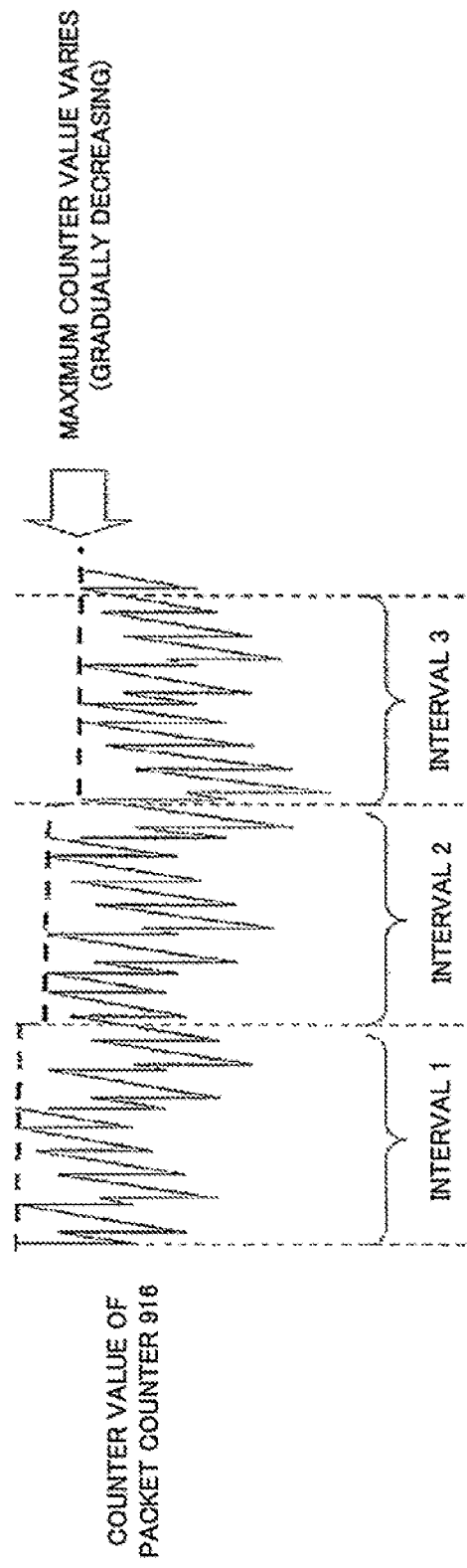
{FIG. 17} A diagram showing the counter value of the packet counter 916 when the clock of the slave node leads that of the master node and the packet network has a delay.

FIGS. 16 and 17 show the counter values when the slave clock is not in synchronization with the master clock, and there are delays added to packets in the packet network. FIG. 16 shows an example where the slave clock is not in synchronization with the master clock, and the slave clock has a clock width smaller than that of the master clock. FIG. 17 shows an example where the slave clock has a clock width greater than that of the master clock.

In the case shown in FIG. 14 where the slave clock is in exact synchronization with the master clock and there is no delay added in the packet network, the counter value has a constant maximum value.

When a packet arrives at the packet counter 916, the counter value increases by a predetermined value. In the meantime, the counter value is decreased according to the speed at which the VCO 144 outputs the clock. In the present example, a predetermined counter value as much as a single packet is subtracted according to the interval of arrival of packets. In the example of FIG. 14, since the slave clock is in synchronization with the master clock, the counter value repeats increasing and decreasing at regular intervals of packet arrival, with the maximum peak of the counter value and the minimum peak of the counter value constant.

Next, FIG. 15 shows the case where the slave clock is in synchronization with the master clock and delays are added in the packet network. Since the addition of a delay results in the lagging arrival of the packet, the amount of subtraction of the counter value increases by the amount of lag. The minimum counter value is smaller than in the example of FIG. 14. Unlike in the example of FIG. 14, the counter values at the arrival of packets are not constant and some are smaller than others. When a packet arrives without delay, the counter value rises to its intended peak value (maximum counter value). Assuming that delay-free packets can arrive within an interval (such as 10 sec), the maximum counter value in that interval is constant. In summary, even if delays are added in the packet network, the maximum values of the counter value monitored in an interval (for example, for a duration where at least one delay-free packet is considered to arrive) are constant as long as the slave clock is in synchronization with the master clock.

The counter value varies at timing between the intervals for acquiring synchronous accuracy information, depending on the magnitude of the delay of the packet that is received at that timing. The amount of variation of the counter value with respect to that in the previous synchronization accuracy measurement can thus be influenced more by a difference resulting from the amount of delay than by a difference resulting from the difference in clock width (difference in speed) between the master clock and the slave clock. In such a case, the difference in clock width (difference in speed) between the master clock and the slave clock may fail to be reflected on the variation of the counter value.

Alternatively, an average counter value in an interval may be employed so that only the packet received at the timing between intervals is used for determination. Such a method can reduce the influence of the amount of delay as compared to the foregoing method, whereas the amount of delay may still have an effect, for example, such that the overall average becomes smaller if the amounts of delay in an interval tends to be greater.

Next, FIGS. 16 and 17 show the cases where the slave clock is not in synchronization with the master clock. FIG. 16 shows the case where the slave clock has a clock width smaller than that of the master clock. As in the example of FIG. 15, the counter values at the arrival of some packets fail to reach the maximum value due to the lagging arrival of the packets because of delays. The maximum value, however, is reached at the arrival of delay-free packets. A difference from FIG. 15 lies in that the maximum counter value varies interval by interval. In the present example, the slave clock has a clock width smaller than that of the master clock. In other words, the slave clock has an output speed lower than that of the master clock. Since the speed of subtraction of the packet counter in the slave node is thus slower than the speed of increase, the counter value increases gradually. The maximum value of the counter value in each interval therefore increases with time.

On the other hand, FIG. 17 shows the case where the slave clock has a clock width greater than that of the master clock. In other words, the slave clock has a speed higher than that of the master clock. As for the difference from FIG. 15, i.e., the variation of the maximum counter value in each interval, the counter value therefore decreases gradually since the speed of subtraction of the packet counter is greater than the speed of increase. The maximum value of the counter value in each interval therefore decreases with time.

Based on the foregoing three cases, the maximum counter value can be monitored to see whether the slave clock is in synchronization with the master clock or not from the variation of the maximum value from one interval to another. That is, the clocks are in synchronization if the maximum counter value remains constant. The clocks are not in synchronization if the maximum counter value varies. If the maximum counter value varies to increase, it can be seen that the slave clock has a clock width smaller than that of the master clock. If the maximum counter value decreases, it can be seen that the slave clock has a clock width greater than that of the master clock. Such a method can be used to exclude the influence of delays for more accurate understanding of the difference in speed.

As described above, using the foregoing second method, the synchronization accuracy monitoring unit 915 measures the maximum counter value of the packet counter 916 in each interval, and notifies the increase/decrease information on the maximum counter value to the filter control unit 914.

The use of the foregoing counter value increase/decrease information acquisition method by the counter value increase/decrease information acquiring unit can exclude the influence of delays for more accurate understanding of the TS deviation between the master clock and the slave clock.

<Effect of First Exemplary Embodiment>

As has been described above, according to the present exemplary embodiment, the filter control unit calculates the TS deviation by using the synchronization accuracy information acquired by the synchronization accuracy monitoring unit and the increase/decrease information on the counter value of the packet counter. The packet filter unit uses the TS deviation to correct the amount of delay D, thereby correcting the arrival timing on the slave clock to that on the slave clock that is in a synchronous state. The slave node performs processing on the generated TS and the received TS under the corrected timing, which makes it possible to calculate the amounts of delay of arriving packets on the slave node side and appropriately and selectively employ the TS of packets according to a set threshold. This consequently provides the effect of rejecting the TS of packets with large amounts of delay and taking only the TS of packets with small amounts of delay into the clock synchronization circuit for improved synchronization accuracy.

The use of the foregoing second method of the counter value increase/decrease information acquisition method by the counter value increase/decrease information acquiring unit provides the effect that it is possible to exclude the influence of delays for more accurate understanding of the TS deviation between the master clock and the slave clock.

<Second Exemplary Embodiment>

Figure 19:
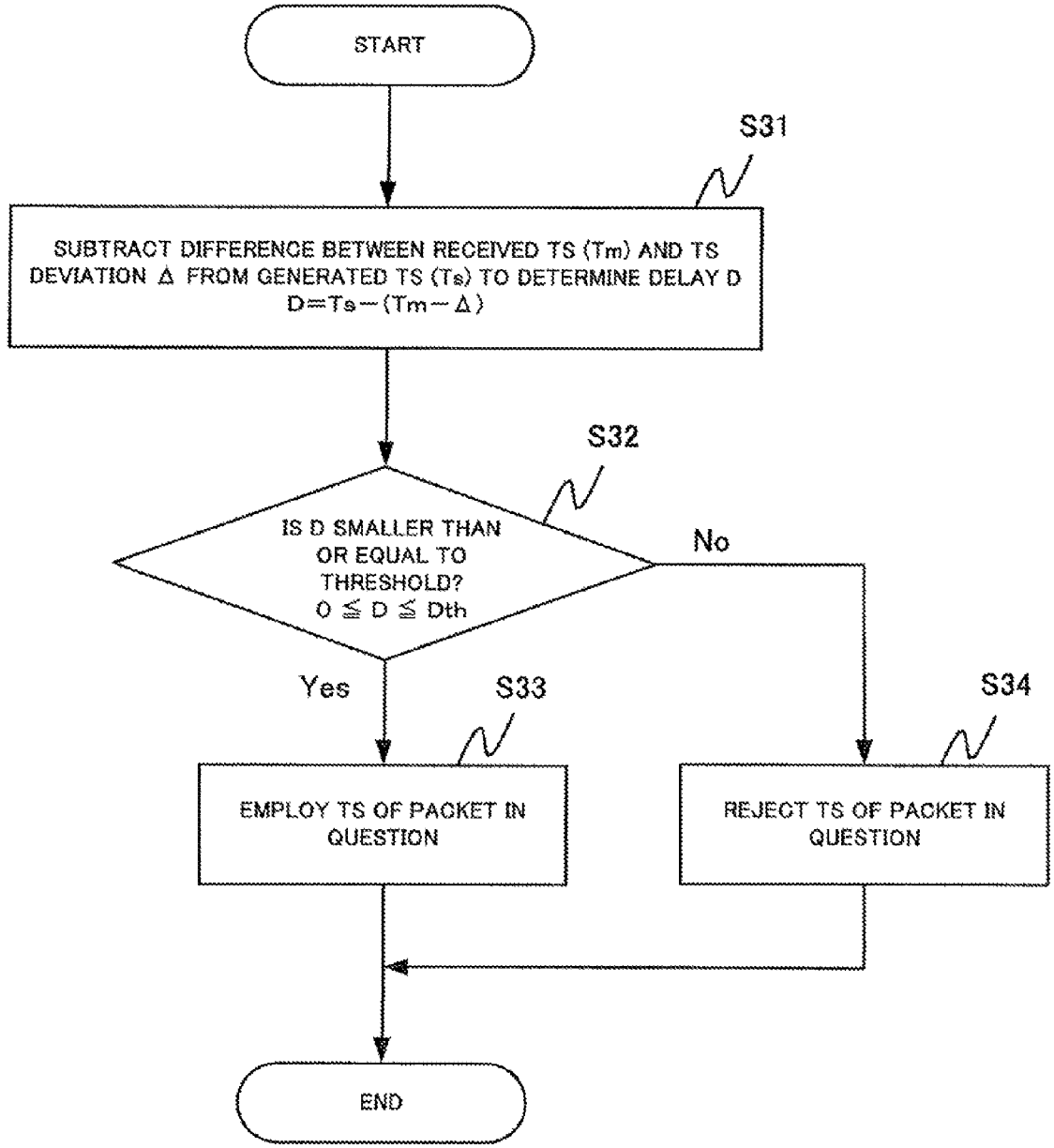
{FIG. 19} A flowchart for the case of using the method of correcting a delay according to a second exemplary embodiment of the present invention.

Hereinafter, a second exemplary embodiment of the present invention will be described. The basic configuration and operation of the present exemplary embodiment are generally the same as those of the first exemplary embodiment. A difference lies in the method by which the packet filter unit 912 corrects the amount of delay D. Hereinafter, the method of correcting the amount of delay D will be described. FIG. 19 shows a flowchart of the correction method.

In step S31, the packet filter unit 912 initially subtracts the remainder of the received TS (Tm) minus the TS deviation $\Delta$ further from the generated TS (Ts) to determine the amount of delay D in consideration of the TS deviation. The equation is as follows:

$$D = Ts - (Tm - \Delta).$$

Next, the packet filter unit 912 determines whether the amount of delay D determined in step S31 is greater than or equal to 0 and smaller than or equal to the threshold Dth (step S32).

If the amount of delay D is greater than or equal to 0 and smaller than or equal to the threshold (Yes at step S32), the packet filter unit 912 proceeds to step S33 to perform the processing of employing the TS of the packet. On the other hand, if the amount of delay D does not satisfy the condition of step S32 (No at step S32), the packet filter unit 912 proceeds to step S34 to perform the processing of rejecting the TS of the packet.

In the example of FIG. 7, according to step S12 of FIG. 10, $\Delta$ is given a negative sign since the slave clock has a clock width smaller than that of the master clock. As in the first exemplary embodiment, the resulting TS deviation is $-\Delta(=-9)$. From the equation of step S31, the corrected amount of delay D of the packet 506 is thus given by:
D32 69−(55−(−9))=69−64=5. Since the condition of step S32, i.e., $0 \leq D \leq$ the threshold Dth =8 is satisfied, the TS of the packet 506 is employed according to step S33. A typical method would result in D32 69−55=14, which is greater than the threshold Dth=8 and the TS of the packet 506 would be rejected according to step S34. It can thus be seen that the correction according to the present exemplary embodiment allows appropriate filter processing.

Similarly, in the example of FIG. 8, according to step S12 of FIG. 10, $\Delta$ is given a positive sign since the slave clock has a clock width greater than that of the master clock. As in the first exemplary embodiment, the resulting TS deviation is $+\Delta(=+6)$. From the equation of step S31, the corrected amount of delay D of the packet 606 is thus given by:

$$D = 52 - (55 - 6) = 52 - 49 = 3.$$

Since the condition of step S32, i.e., $0 \leq D \leq$ the threshold Dth=8 is satisfied, the TS of the packet 606 is employed according to step S33. A typical method would result in D=52−55=−3, which is smaller than the threshold of 0 and the TS of the packet 606 would be rejected according to step S34. It can thus be seen that the correction according to the present exemplary embodiment allows appropriate filter processing.

In summary, the present exemplary embodiment uses the method of correcting the amount of delay D unlike the first exemplary embodiment. For the filtering condition, the TS of the packet shall be employed when the following condition is satisfied:

$$0 \leq Ts - (Tm - \Delta) \leq Dth.$$

The configuration of the packet filter unit 912 for implementing the foregoing correction method will be described with reference to FIG. 12. The packet filter unit 912 includes subtractors 1101 and 1102 and a comparator 1100. A difference from the packet filter unit 350 lies in that the subtractor 1101 calculates a difference between the TS deviation $\Delta$ received from the filter control unit 914 and the received TS, and the subtractor 1101 subtracts the resulting difference from the generated TS. The generated TS is corrected by such processing. The subtraction information (Tm−$\Delta$) is input to the subtractor 1101. A difference between the subtraction information (Tm−$\Delta$) and the generated TS (Ts) input from the master node 100 is calculated and input to the comparator 1100. The comparator 1100 performs a comparison calculation according to filtering conditions (1) to (3) seen below, which include the threshold Dth set from the setting IF and the difference information Ts−(Tm−$\Delta$), and performs filter processing according to the filtering condition to which the TS of the packet corresponds.

$$0 \leq Ts - (Tm - \Delta) \leq Dth \quad (1)$$

→Employ the TS of the packet, transfer the TS to the PLL 140.

$$(Ts-(Tm-\square)<0 \quad (2)$$

→Reject the TS of the packet.

$$Dth<Ts-(Tm-\square) \quad (3)$$

→Reject the TS of the packet.

<Effect of Second Exemplary Embodiment>

The present exemplary embodiment described so far provides the same effect as that of the first exemplary embodiment. According to the present exemplary embodiment, the filter control unit calculates the TS deviation by using the synchronization accuracy information acquired by the synchronization accuracy monitoring unit and the increase/decrease information on the counter value of the packet counter: The packet filter unit uses the TS deviation to correct the amount of delay D, thereby correcting the arrival timing on the slave clock to that on the slave clock that is in a synchronous state. The slave node performs processing on the generated TS and the received TS under the corrected timing, which makes it possible to calculate the amounts of delay of arriving packets on the slave node side and appropriately and selectively employ the TS of packets according to the set threshold. This consequently provides the effect of rejecting the TS of packets with large amounts of delay and taking only the TS of packets with small amounts of delay into the clock synchronization circuit for improved synchronization accuracy.

<Third Exemplary Embodiment>

Hereinafter, a third exemplary embodiment of the present invention will be described. The basic configuration and operation of the present exemplary embodiment are generally the same as those of the first exemplary embodiment and the second exemplary embodiment. A difference lies in that the packet filter unit corrects not the amount of delay D but the threshold Dth for the amount of delay.

The correction method according to the present exemplary embodiment is one in which the packet filter unit corrects the threshold Dth. The TS deviation Δ can be subtracted from the threshold Dth to determine a threshold Dth in consideration of the TS deviation.

In the example of FIG. 7, according to step S12 of FIG. 10, Δ is given a negative sign since the slave clock has a clock width smaller than that of the master clock. The resulting TS deviation is −Δ(=−9). Correcting the threshold Dth for the amount of delay thus results in the following filtering condition:

$$0-(-\Delta)\leq D\leq Dth-(-\Delta) \Rightarrow 9\leq D\leq 17.$$

In consequence, 9≤D=69−55=14≤17 is satisfied, and the TS of the packet 506 is employed. A typical method would result in D=69−55=14, which is greater than the threshold Dth=8 and the TS would be rejected. The correction according to the present exemplary embodiment thus allows appropriate filter processing.

Similarly, in the example of FIG. 8, according to step S12 of FIG. 10, □ is given a positive sign since the slave clock has a clock width greater than that of the master clock. The resulting TS deviation is +□(=6). Correcting the threshold Dth for the amount of delay thus results in the following filtering condition:

$$0-(+\Delta)\leq D\leq Dth-(+\Delta) \Rightarrow -6\leq D\leq 2.$$

In consequence, −6≤D=52−55=−3≤2 is satisfied, and the TS of the packet 606 is employed. A typical method would result in D=52−55=−3, which is smaller than the threshold of 0 and the TS would be rejected. The correction according to the present exemplary embodiment thus allows appropriate filter processing.

In summary, according to the present exemplary embodiment, the packet filter unit 912 corrects the threshold Dth for the amount of delay. As for the filtering condition, the TS of the packet shall be employed when the following condition is satisfied:

$$-\Delta\leq Ts-Tm\leq Dth-\Delta.$$

Figure 13:
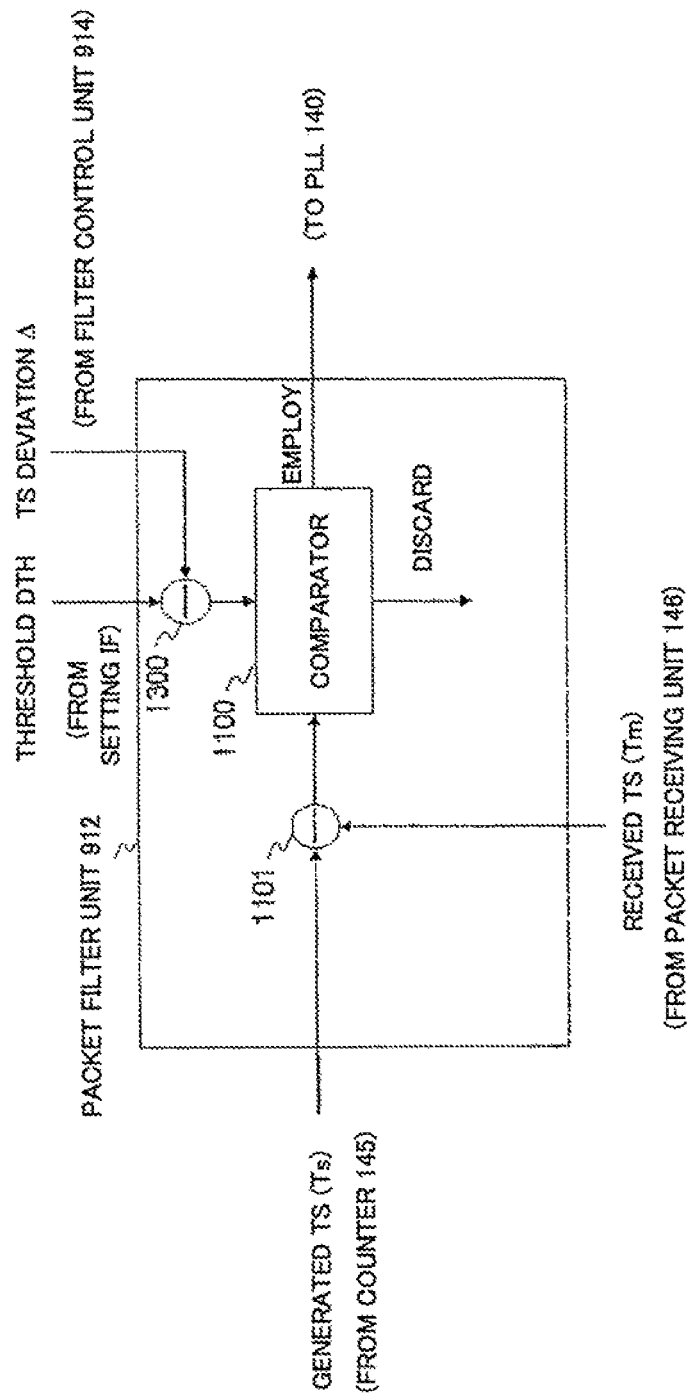
{FIG. 13} An example of a detailed block diagram of the packet filter unit 912 when using a second method of correction of the present invention.

FIG. 13 shows the configuration of the packet filter unit 912 according to the present exemplary embodiment. The packet filter unit 912 includes a subtractor 1101, a comparator 1100, and a subtractor 1300. A difference from the typical packet filter unit 350 lies in that the subtractor 1300 subtracts the TS deviation Δ received from the filter control unit 914 from the threshold Dth. The generated TS is indirectly corrected by such an operation.

The generated TS (Ts) received from the counter 145 and the received TS (Tm) received from the packet receiving unit 911 are input to the subtractor 1101. A difference Ts−Tm is calculated and input to the comparator 1100. The threshold Dth set from the setting IF and the TS deviation Δ input from the filter control unit 914 are input to the subtractor 1200. A difference Dth−Δ is calculated and input to the comparator 1100. The comparator 1100 performs a comparison calculation according to filtering conditions (1) to (3) seen below, which include the difference information Dth−Δ on the threshold Dth and the difference information Ts−Tm on TS, and performs filter processing according to the filtering condition to which the TS of the packet corresponds.

$$-\Delta\leq Ts-Tm\leq Dth-\Delta \quad (1)$$

→Employ the TS of the packet, transfer the TS to the PLL 140.

$$Ts-Tm<-\Delta \quad (2)$$

→Reject the TS of the packet.

$$Dth-\Delta<Ts-Tm \quad (3)$$

→Reject the TS of the packet.

21 Effect of Third Exemplary Embodiment>

The present exemplary embodiment described so far provides the same effect as that of the first exemplary embodiment and the second exemplary embodiment. According to the present exemplary embodiment, the filter control unit calculates the TS deviation by using the synchronization accuracy information acquired by the synchronization accuracy monitoring unit and the increase/decrease information on the counter value of the packet counter. The packet filter unit uses the TS deviation to correct the threshold Dth for the amount of delay D, thereby correcting the arrival timing on the slave clock to that on the slave clock that is in a synchronous state. The slave node performs processing on the generated TS and the received TS under the corrected timing, which makes it possible to calculate the amounts of delay of arriving packets on the slave node side and appropriately and selectively employ the TS of packets according to the set threshold. This consequently provides the effect of rejecting the TS of packets with large amounts of delay and taking only the TS of packets with small amounts of delay into the clock synchronization circuit for improved synchronization accuracy.

REFERENCE SIGNS LIST

100, 900: master node
110, 310: slave node 120 (120-1, 2, 3, 4, 5), 405, 406, 407, 506, 606, 706, 806: packet
130: packet network
140: PLL
141: phase comparator
142: LPF
143: P1 circuit
1.44: VCO
145: counter
146: packet receiving unit
350, 912: packet filter unit
401: time axis of master node
402: master clock
403: time axis of slave node
404, 501, 601: slave clock
901: packet generating unit
902: packet transmitting unit
914: filter control unit
915: synchronization accuracy monitoring unit
916: packet counter
1100: comparator
1101, 1102, 1300: subtractor
1200: adder

The invention claimed is:

1. A clock synchronization system for synchronizing a clock of a slave node with a clock of a master node, the system comprising:
the master node including a packet transmitter configured to transmit a packet including a time stamp to the slave node, and
the slave node including:
a packet receiver configured to receive the packet transmitted from the master node;
a packet filter configured to calculate as a value of delay of the packet a difference between a time stamp on the clock of the slave node when the packet is received and the time stamp of the packet received, to correct the value of the delay of the packet or a threshold for the delay of the packet based on a time stamp deviation between a time stamp obtained by the clock of the slave node when the slave node is in synchronism with the master node and a time stamp obtained by the clock of the slave node when the slave node is not in synchronism with the master node, and to perform filter processing on the packet received from the packet receiver based on the value of the delay of the packet and the threshold for the delay of the packet; and
a phase synchronizer configured to output the clock of the slave node based on the time stamp included in the packet that is employed by the packet filter.

2. The clock synchronization system according to claim 1, wherein
the slave node includes:
a synchronization accuracy monitor configured to measure synchronization accuracy between the master node and the slave node; and
a filter controller configured to calculate a time stamp deviation based on the synchronization accuracy, a predetermined synchronization accuracy measurement interval, and a predetermined time stamp by which the clock of the master node proceeds per unit time.

3. The clock synchronization system according to claim 2, wherein
the packet filter corrects the time stamp on the clock of the slave node at which the packet receiver receives the packet from the master node by adding the time stamp deviation to the time stamp on the clock of the slave node, and performs the filter processing with a difference between the corrected time stamp on the clock of the slave node and the time stamp stored in the received packet as the delay.

4. The clock synchronization system according to claim 2, wherein
the packet filter corrects the threshold for the delay of the packet by subtracting the time stamp deviation from the threshold for the delay of the packet, and performs the filter processing by using the corrected threshold for the delay of the packet.

5. The clock synchronization system according to claim 1, wherein
the packet filter rejects the time stamp of a packet among packets the packet receiver receives that has a delay greater than the threshold for the delay of the packet, and employs the time stamp of a packet that has a delay smaller than or equal to the threshold for the delay of the packet.

6. A node for synchronizing a clock of the node with a clock of a master node, comprising:
a packet receiver configured to receive a packet including a time stamp from the master node through a network;
a packet filter configured to calculate as a value of delay of the packet a difference between a time stamp on the clock of the node when the packet is received and the time stamp of the packet received, to correct the value of the delay of the packet or a threshold for the delay of the packet based on a time stamp deviation between a time stamp obtained by the clock of the the node when the node is in synchronism with the master node and a time stamp obtained by the clock of the node when the node is not in synchronism with the master node, and to perform filter processing on the packet received from the packet receiver based on the value of the delay of the packet and the threshold for the delay of the packet; and
a phase synchronizer configured to output the clock of the node based on the time stamp included in the packet that is employed by the packet filter.

7. The node according to claim 6, comprising:
a synchronization accuracy monitor configured to measure synchronization accuracy between the master node and the node; and
a filter controller configured to calculate a time stamp deviation based on the synchronization accuracy, a predetermined synchronization accuracy measurement interval, and a predetermined time stamp by which the clock of the master node proceeds per unit time.

8. The node according to claim 7, wherein
the packet filter corrects the time stamp on the clock of the node at which the packet receiver receives the packet from the master node by adding the time stamp deviation to the time stamp on the clock of the node, and performs the filter processing with a difference between the corrected time stamp on the clock of the node and the time stamp stored in the received packet as the delay.

9. The node according to claim 7, wherein
the packet filter corrects the threshold for the delay of the packet by subtracting the time stamp deviation from the threshold for the delay of the packet, and performs the filter processing by using the corrected threshold for the delay of the packet.

10. The node according to claim 6, wherein
the packet filter rejects the time stamp of a packet among packets the packet receiver receives that has a delay greater than the threshold for the delay of the packet, and employs the time stamp of a packet that has a delay smaller than or equal to the threshold for the delay of the packet.

11. A clock synchronization method for synchronizing a clock of a slave node with a clock of a master node, the method comprising:
   receiving a packet including a time stamp through a network;
   calculating as a value of delay of the packet a difference between a time stamp on the clock of the slave node when the packet is received and the time stamp of the packet received;
   correcting the value of the delay of the packet or a threshold for the delay of the packet based on a time stamp deviation between a time stamp obtained by the clock of the slave node when the slave node is in synchronism with the master node and a time stamp obtained by the clock of the slave node when the slave node is not in synchronism with the master node;
   performing filter processing on the received packet based on the value of the delay of the packet and the threshold for the delay of the packet; and
   outputting the clock of the slave node based on the time stamp included in the packet that is employed in the filter processing.

12. The clock synchronization method according to claim 11, comprising:
   measuring synchronization accuracy between the master node and the slave node; and
   calculating a time stamp deviation based on the synchronization accuracy, a predetermined synchronization accuracy measurement interval, and a predetermined time stamp by which the clock of the master node proceeds per unit time.

13. A non-transitory computer-readable medium stored therein a program for synchronizing a clock of a slave node with a clock of a master node, the program causing a computer to execute:
   packet receiving processing of receiving a packet including a time stamp from the master node through a network;
   packet filter processing of calculating as a value of delay of the packet a difference between a time stamp on the clock of the slave node when the packet is received and the time stamp of the packet received, correcting the value of the delay of the packet or a threshold for the delay of the packet based on a time stamp deviation between a time stamp obtained by the clock of the slave node when the slave node is in synchronism with the master node and a time stamp obtained by the clock of the slave node when the slave node is not in synchronism with the master node, and performing filter processing based on the value of the delay of the packet and the threshold for the delay of the packet corrected; and
   phase synchronization processing of outputting the clock of the slave node based on the time stamp included in the packet that is employed in the packet filter step.

* * * * *